(12) United States Patent
Sakio et al.

(10) Patent No.: US 10,934,614 B2
(45) Date of Patent: Mar. 2, 2021

(54) VAPOR DEPOSITION MASK, VAPOR DEPOSITION MASK PRODUCTION METHOD, AND ORGANIC SEMICONDUCTOR ELEMENT PRODUCTION METHOD

(71) Applicant: HON HAI PRECISION INDUSTRY CO., LTD., New Taipei (TW)

(72) Inventors: Susumu Sakio, Osaka (JP); Katsuhiko Kishimoto, Osaka (JP); Koshi Nishida, Osaka (JP); Kozo Yano, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 8 days.

(21) Appl. No.: 16/087,111

(22) PCT Filed: Jul. 28, 2016

(86) PCT No.: PCT/JP2016/072181
§ 371 (c)(1),
(2) Date: Sep. 21, 2018

(87) PCT Pub. No.: WO2017/163443
PCT Pub. Date: Sep. 28, 2017

(65) Prior Publication Data
US 2019/0100834 A1    Apr. 4, 2019

(30) Foreign Application Priority Data
Mar. 23, 2016 (JP) .............................. JP2016-058312

(51) Int. Cl.
*C23C 14/04* (2006.01)
*C23C 14/24* (2006.01)
(Continued)

(52) U.S. Cl.
CPC ............ *C23C 14/042* (2013.01); *B23K 11/11* (2013.01); *C23C 14/12* (2013.01); *C23C 14/24* (2013.01);
(Continued)

(58) Field of Classification Search
None
See application file for complete search history.

(56) References Cited

U.S. PATENT DOCUMENTS

| | | | |
|---|---|---|---|
| 2005/0130422 A1* | 6/2005 | Theiss | H01L 21/0337 438/689 |
| 2009/0137180 A1* | 5/2009 | Sung | C23C 14/042 445/60 |
| 2016/0115580 A1* | 4/2016 | Mizumura | C23C 14/042 118/720 |

FOREIGN PATENT DOCUMENTS

| JP | 2013-142195 A | 7/2013 | |
|---|---|---|---|
| JP | 2014205870 A * | 10/2014 | ........... C23C 14/042 |

(Continued)

OTHER PUBLICATIONS

English translation of JP-2014205870-A. (Year: 2014).*

*Primary Examiner* — Charles Capozzi
(74) *Attorney, Agent, or Firm* — ScienBiziP, P.C.

(57) ABSTRACT

A vapor deposition mask (100) includes a resin layer (10) including a plurality of openings (11); a magnetic metal layer (20) located so as to overlap the resin layer, the magnetic metal layer including a mask portion (20a) having such a shape as to expose the plurality of openings and a peripheral portion (20b) located so as to enclose the mask portion; and a frame (30) secured to the peripheral portion of the magnetic metal layer. The resin layer is not joined to the mask portion of the magnetic metal layer but is joined to at least a part of the peripheral portion of the magnetic metal layer.

8 Claims, 13 Drawing Sheets

(51) Int. Cl.
*C23C 14/12* (2006.01)
*B23K 11/11* (2006.01)
*H01L 51/50* (2006.01)
*H01L 51/00* (2006.01)

(52) U.S. Cl.
CPC ...... *H01L 51/5036* (2013.01); *H01L 51/0011* (2013.01)

(56) References Cited

FOREIGN PATENT DOCUMENTS

| | | |
|---|---|---|
| JP | 2015-010270 A | 1/2015 |
| JP | 2015-059262 A | 3/2015 |

\* cited by examiner

FIG.3
(a) 
(b) 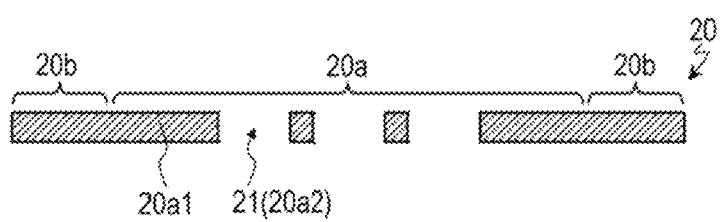
(c) 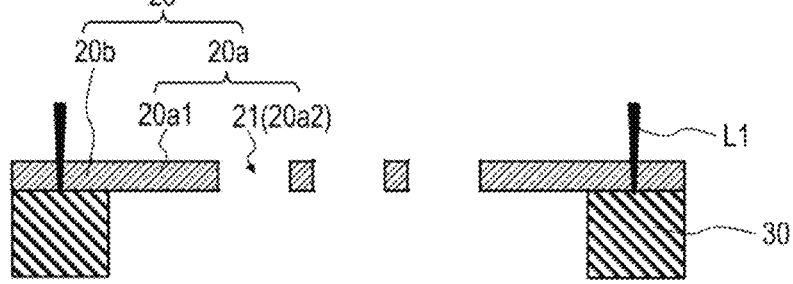
(d) 
(e) 
(f) 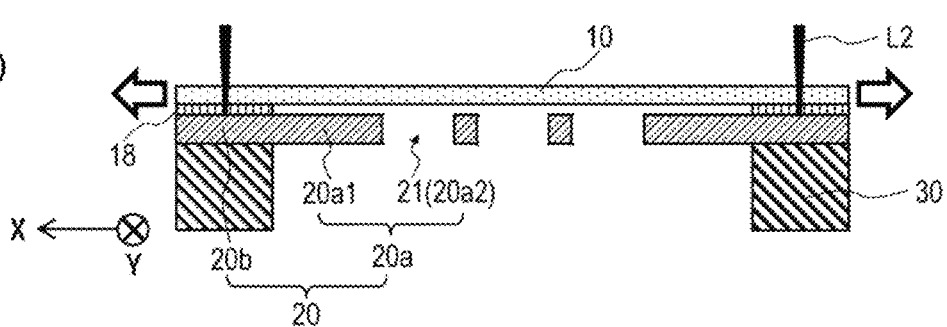
(g) 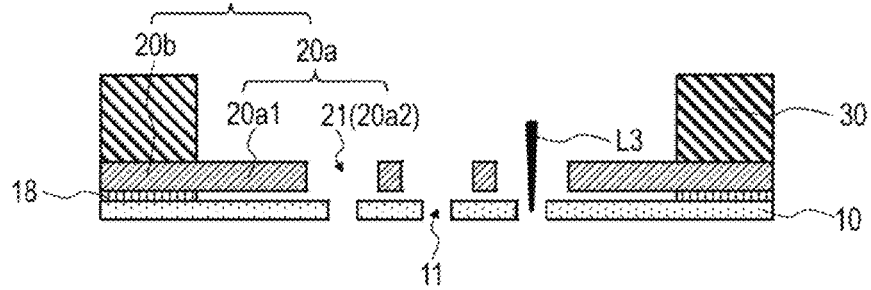

FIG.6
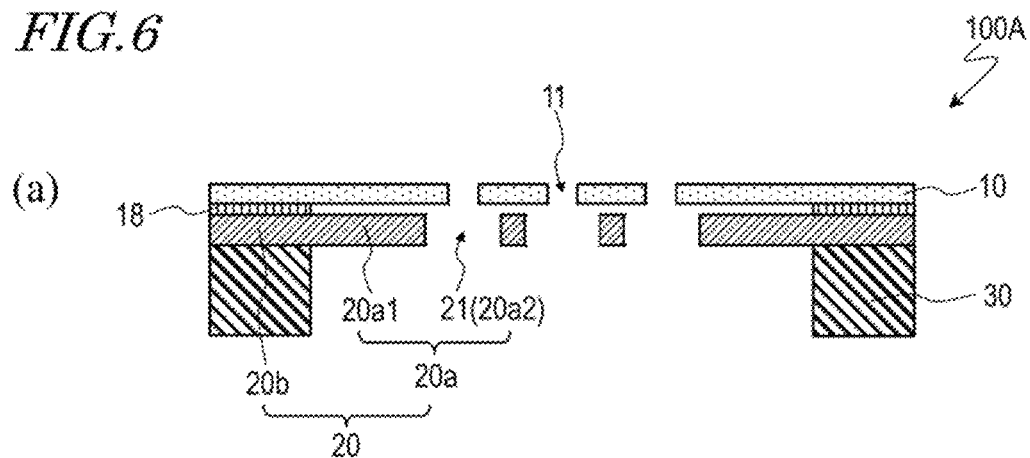
(a)
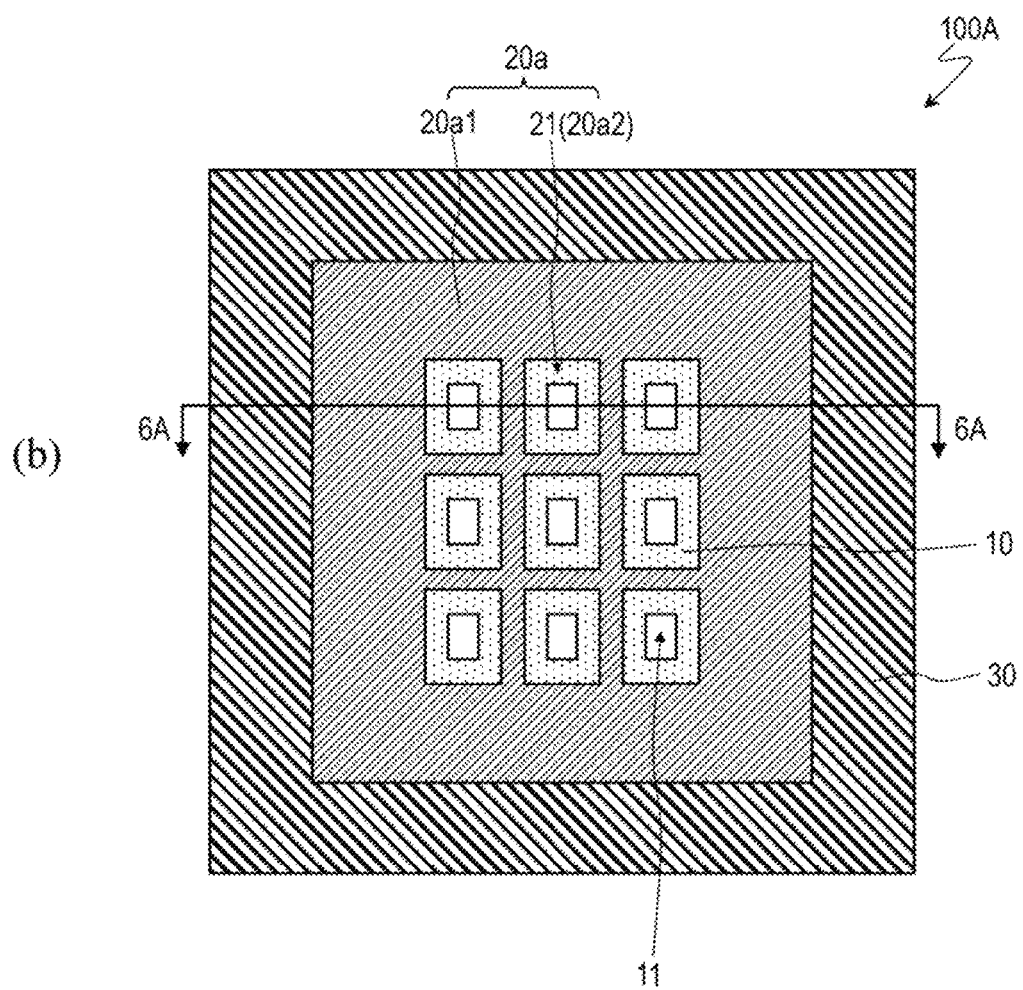
(b)

FIG. 7
(a)
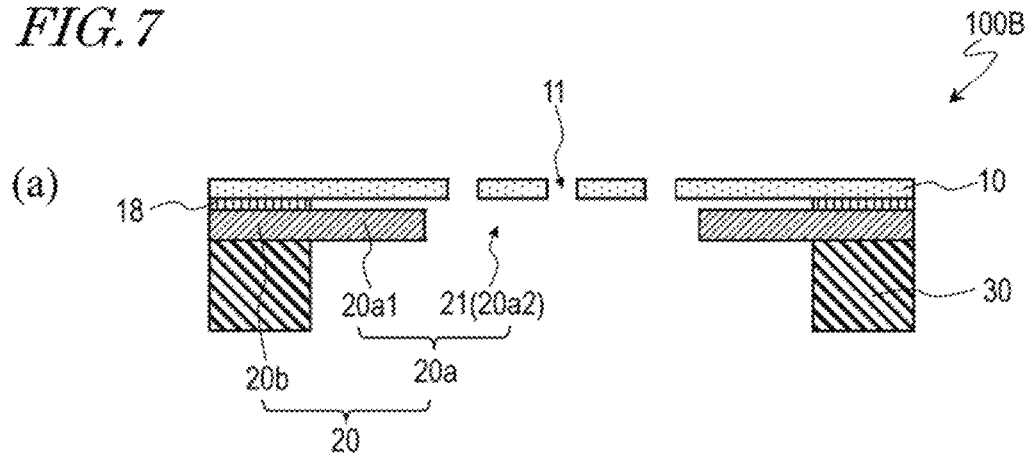
(b)
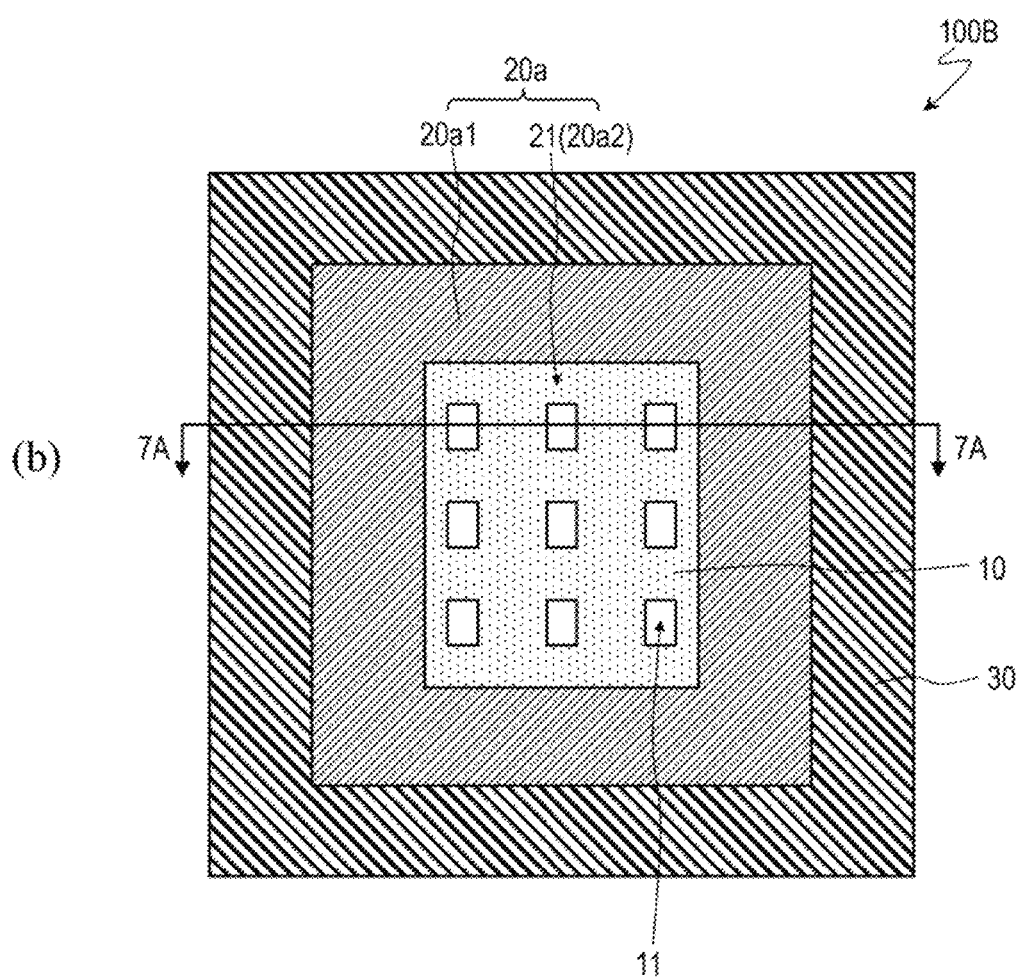

*FIG.8*
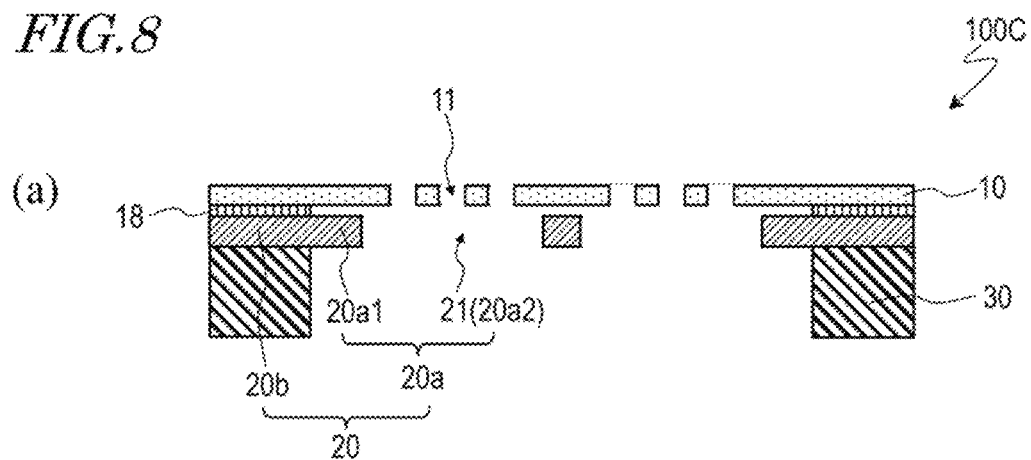
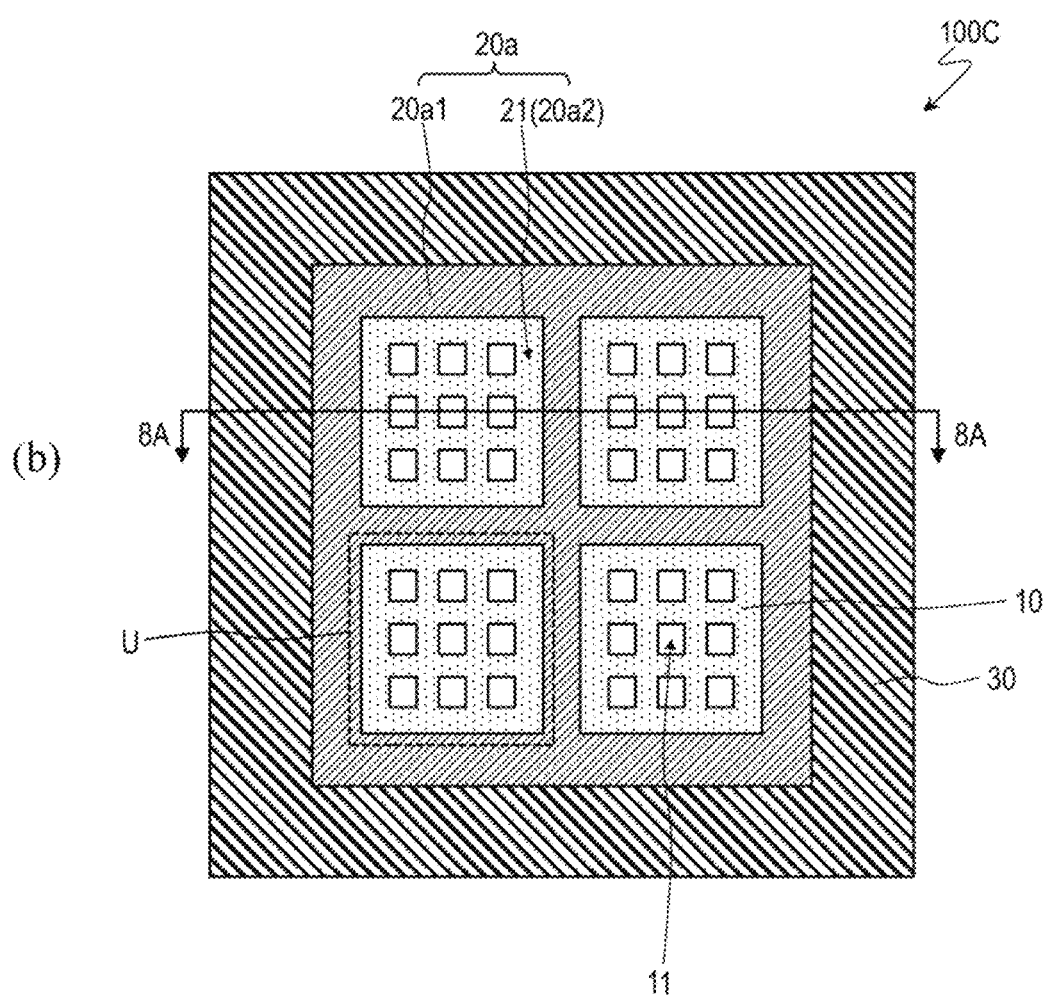

FIG.9
(a)
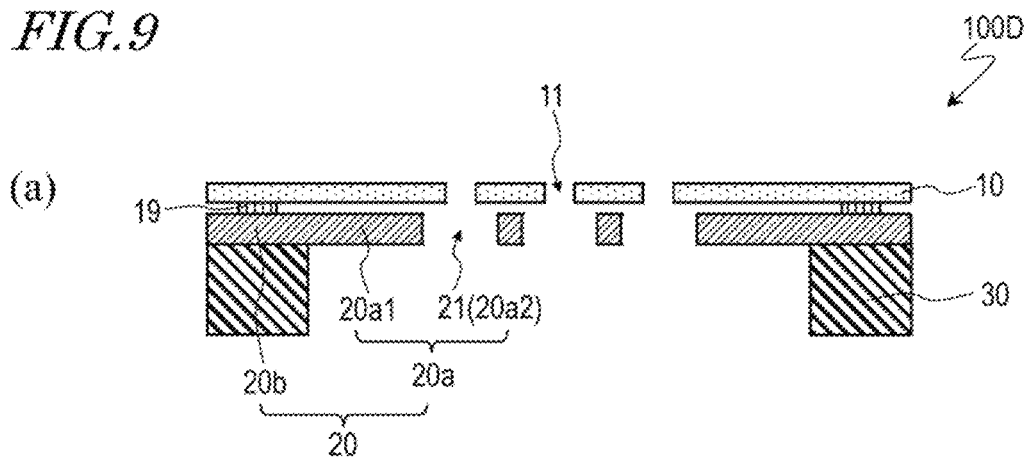
(b)
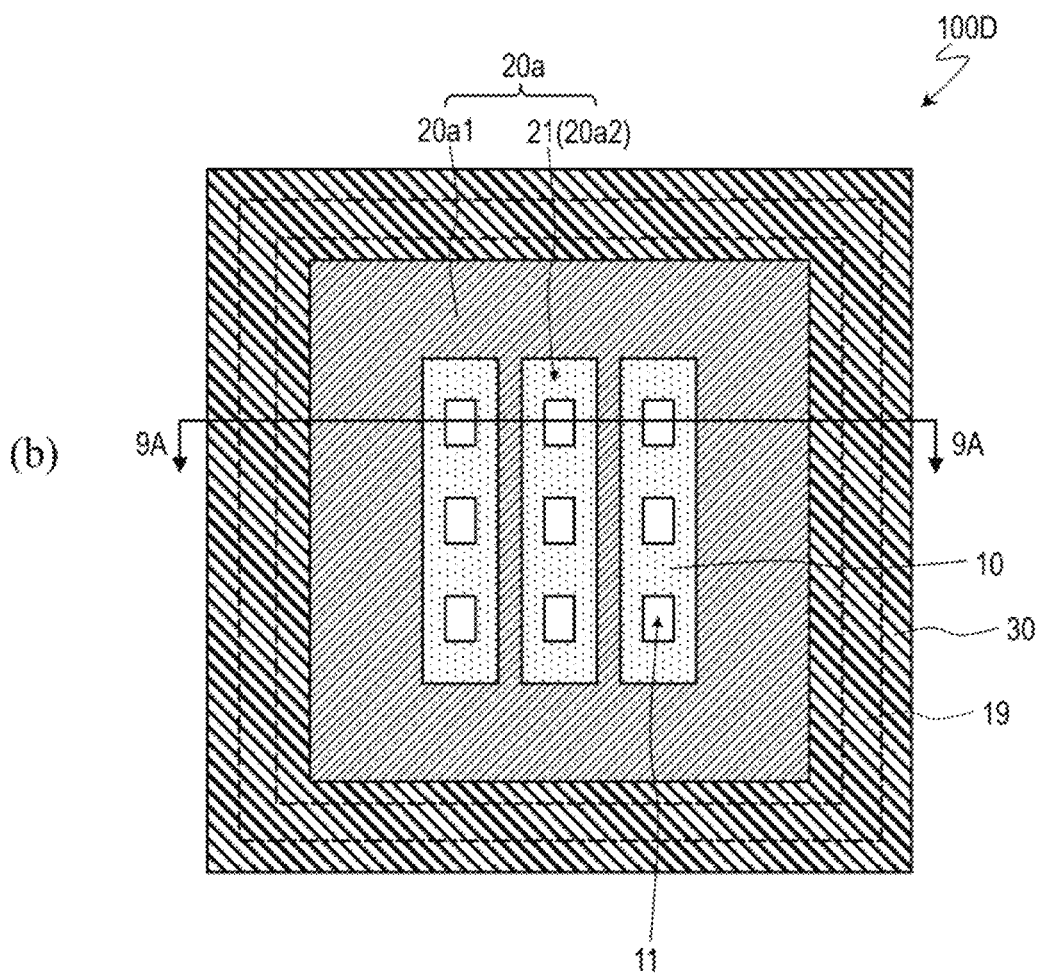

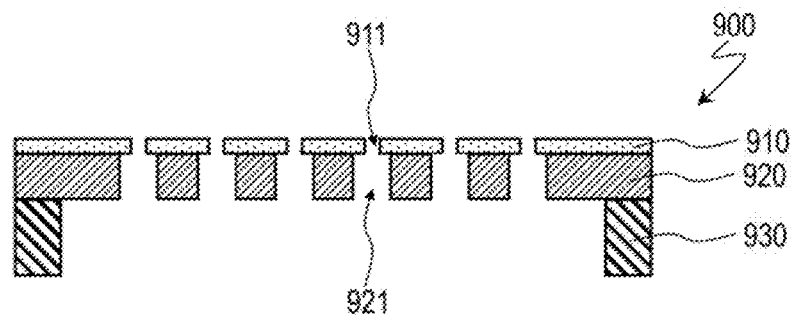
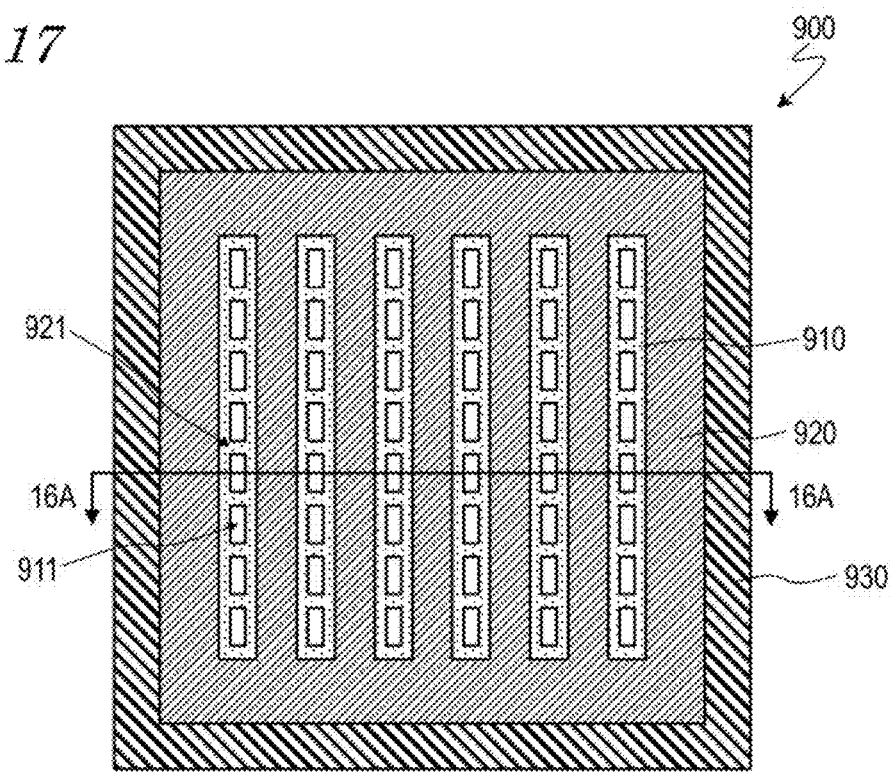

VAPOR DEPOSITION MASK, VAPOR DEPOSITION MASK PRODUCTION METHOD, AND ORGANIC SEMICONDUCTOR ELEMENT PRODUCTION METHOD

TECHNICAL FIELD

The present invention relates to a vapor deposition mask, specifically to a vapor deposition mask including a resin layer and a magnetic metal layer. The present invention also relates to a method for producing such a vapor deposition mask and a method for producing an organic semiconductor device.

BACKGROUND ART

Recently, an organic EL (Electro-Luminescence) display device is a target of attention as a next-generation display device. In organic EL display devices currently mass-produced, an organic EL layer is formed by use of, mainly, a vacuum vapor deposition method.

Typically, a mask made of a metal (a metal mask) is used as the vapor deposition mask. However, it is becoming difficult to use a metal mask to form a vapor deposition pattern with high precision as organic EL display devices are becoming of a higher definition, for the following reason. In general, a metal mask is used to form a vapor deposition pattern as follows. A metal foil is etched by use of a photolithography process to form through-holes (openings) in correspondence with the vapor deposition pattern, and then, the metal foil is welded to a frame while tension is applied on the metal foil (this step is referred to as a "tensioning step"). Therefore, it is difficult to form the openings at high positional precision. This is why it is becoming difficult to use a metal mask to form a vapor deposition pattern with high precision. In addition, a metal plate (metal foil) that is to be the metal mask has a thickness (e.g., about 100 μm) that is significantly greater than the size of the openings (e.g., about 10 to about 20 μm), which causes a so-called shadow. This is also why it is becoming difficult to use a metal mask to form a vapor deposition pattern with high precision.

In such a situation, a vapor deposition mask having a structure in which a resin layer and a metal layer are layered together (hereinafter, referred to also as a "layered mask") is proposed to be used for forming a high-definition vapor deposition pattern. For example, Patent Documents Nos. 1 and 2 each disclose a vapor deposition mask having a structure in which a layered body of a resin film and a sheet-like magnetic metal member is supported by a frame having a shape of a picture frame. The resin film has a plurality of openings formed therein in correspondence with a desired vapor deposition pattern. The magnetic metal member has a plurality of slits (through-holes), larger than the openings of the resin film, formed therein so as to expose the openings of the resin film. Therefore, when the vapor deposition mask of Patent Document No. 1 or No. 2 is used, the vapor deposition pattern is formed in correspondence with the plurality of openings of the resin film. The plurality of openings of the resin film may be formed by laser processing after a tensioning step and a welding step. Therefore, such a layered mask has the openings in correspondence with the vapor deposition pattern at high positional precision. In addition, the resin film is thinner than a metal plate for an ordinary metal mask. Therefore, the above-described shadow does not easily occur. For these reasons, use of a layered mask allows a vapor deposition pattern of a higher definition to be formed than use of a metal mask.

CITATION LIST

Patent Literature

Patent Document No. 1: Japanese Laid-Open Patent Publication No. 2014-121720
Patent Document No. 2: Japanese Laid-Open Patent Publication No. 2014-205870

SUMMARY OF INVENTION

Technical Problem

However, in the case where the layered mask as disclosed in each of Patent Documents Nos. 1 and 2 is used to perform a vapor deposition step, a gap is made between a substrate as an object on which vapor deposition is to be performed and the mask (the reason for this will be described below in detail). This causes a vapor deposition material to be put on a rear surface of the mask, and as a result, a phenomenon occurs that an edge of the vapor deposition pattern is blurred (referred to as "film formation blur").

The present invention made in light of the above-described situation has an object of providing a vapor deposition mask that suppresses film formation blur from occurring and thus is preferably usable to form a high-definition vapor deposition pattern. Another object of the present invention is to provide a method for producing such a vapor deposition mask in a preferred manner and a method for producing an organic semiconductor device by use of such a vapor deposition mask.

Solution to Problem

A vapor deposition mask in an embodiment according to the present invention includes a resin layer including a plurality of openings; a magnetic metal layer located so as to overlap the resin layer, the magnetic metal layer including a mask portion having such a shape as to expose the plurality of openings and a peripheral portion located so as to enclose the mask portion; and a frame secured to the peripheral portion of the magnetic metal layer. The resin layer is not joined to the mask portion of the magnetic metal layer but is joined to at least a part of the peripheral portion of the magnetic metal layer.

In an embodiment, the magnetic metal layer is not receiving tension in any in-plane directions of the magnetic metal layer from the frame.

In an embodiment, the resin layer is receiving tension in an in-plane direction of the resin layer from the frame and the magnetic metal layer.

In an embodiment, the tension received by the resin layer is set such that an amount of elastic deformation of the resin layer caused by the tension is larger than, or equal to, an amount of thermal expansion of the resin layer caused when there is a temperature rise of 1° C.

In an embodiment, the tension received by the resin layer is set such that an amount of elastic deformation of the resin layer caused by the tension is larger than, or equal to, an amount of thermal expansion of the resin layer caused when there is a temperature rise of 20° C.

In an embodiment, where a material forming the magnetic metal layer has a linear thermal expansion coefficient of $\alpha M$ and a material forming the frame has a linear thermal expansion coefficient of αF, the relationship of 0.5 αM≤αF≤2.0 αM is satisfied.

In an embodiment, the magnetic metal layer and the frame are formed of the same material as each other.

In an embodiment, the vapor deposition mask further includes a metal film located between the peripheral portion of the magnetic metal layer and the resin layer and fixed to the resin layer. The metal film is welded to the peripheral portion of the magnetic metal layer; and the resin layer is joined to the magnetic metal layer via the metal film.

A method for producing a vapor deposition mask in an embodiment according to the present invention is a method for producing a vapor deposition mask including a resin layer, a magnetic metal layer located so as to overlap the resin layer, and a frame supporting the magnetic metal layer. The method includes the steps of: (A) providing the magnetic metal layer formed of a magnetic metal material; (B) securing the frame to a part of the magnetic metal layer; and (C) joining the resin layer to the magnetic metal layer after the step (B). Where a region of the magnetic metal layer that does not overlap the frame after the step (B) is referred to as a first region and a region of the magnetic metal layer that overlaps the frame after the step (B) is referred to as a second region, the step (C) is performed such that the resin layer is not joined to the first region of the magnetic metal layer but is joined to at least a part of the second region of the magnetic metal layer.

In an embodiment, the step (B) is performed in a state where no external tension is applied on the magnetic metal layer in any in-plane directions of the magnetic metal layer.

In an embodiment, the step (C) is performed in a state where external tension is applied on the resin layer in an in-plane direction of the resin layer.

In an embodiment, the tension to be applied on the resin layer in the step (C) is set such that an amount of elastic deformation of the resin layer caused by the tension is larger than, or equal to, an amount of thermal expansion of the resin layer caused when there is a temperature rise of 1° C.

In an embodiment, the tension to be applied on the resin layer in the step (C) is set such that an amount of elastic deformation of the resin layer caused by the tension is larger than, or equal to, an amount of thermal expansion of the resin layer caused when there is a temperature rise of 20° C.

In an embodiment, where a material forming the magnetic metal layer has a linear thermal expansion coefficient of αM and a material forming the frame has a linear thermal expansion coefficient of αF, the relationship of 0.5 αM≤αF≤2.0 αM is satisfied.

In an embodiment, the frame is formed of a magnetic metal material that is the same as that of the magnetic metal layer.

In an embodiment, the method for producing a vapor deposition mask according to the present invention further includes step (D) of, before the step (B), processing the magnetic metal layer such that the magnetic metal layer includes a mask portion including a solid portion where a metal film is present and a hollow portion where no metal film is present and also includes a peripheral portion located so as to enclose the mask portion. In the step (B), the frame is secured to the peripheral portion of the magnetic metal layer.

In an embodiment, the method for producing a vapor deposition mask according to the present invention further includes step (E) of, after the step (C), forming a plurality of openings in the resin layer.

In an embodiment, in the step (E), the plurality of openings are formed in a region of the resin layer that corresponds to the hollow portion of the mask portion.

In an embodiment, the method for producing a vapor deposition mask according to the present invention further includes, before the step (C), step (F) of providing a resin layer formed of a resin material; and step (G) of forming a metal film as being fixed to a part of the provided resin layer. In the step (C), the metal film is welded to the magnetic metal layer to join the resin layer to the magnetic metal layer via the metal film.

A method for producing an organic semiconductor device in an embodiment according to the present invention includes a step of vapor-depositing an organic semiconductor material to a work by use of a vapor deposition mask having any one of the above-described structures.

Advantageous Effects of Invention

An embodiment according to the present invention provides a vapor deposition mask that suppresses film formation blur from occurring and thus is preferably usable to form a high-definition vapor deposition pattern.

BRIEF DESCRIPTION OF DRAWINGS

FIG. 3(a) through FIG. 3(g) are each a cross-sectional view showing a step of a method for producing the vapor deposition mask 100.

FIG. 6(a) and FIG. 6(b) are respectively a cross-sectional view and a plan view schematically showing a vapor deposition mask 100A in another embodiment according to the present invention; FIG. 6(a) shows a cross-section taken along line 6A-6A in FIG. 6(b).

FIG. 7(a) and FIG. 7(b) are respectively a cross-sectional view and a plan view schematically showing a vapor deposition mask 100B in still another embodiment according to the present invention; FIG. 7(a) shows a cross-section taken along line 7A-7A in FIG. 7(b).

FIG. 8(a) and FIG. 8(b) are respectively a cross-sectional view and a plan view schematically showing a vapor deposition mask 100C in still another embodiment according to the present invention; FIG. 8(a) shows a cross-section taken along line 8A-8A in FIG. 8(b).

FIG. 9(a) and FIG. 9(b) are respectively a cross-sectional view and a plan view schematically showing a vapor deposition mask 100D in still another embodiment according to the present invention; FIG. 9(a) shows a cross-section taken along line 9A-9A in FIG. 9(b).

FIG. 16 is a cross-sectional view showing a vapor deposition mask 900 disclosed in Patent Document No. 1, and shows a cross-section taken along line 16A-16A in FIG. 17.

FIG. 17 is a plan view showing the vapor deposition mask 900.

DESCRIPTION OF EMBODIMENTS

Figure 1:
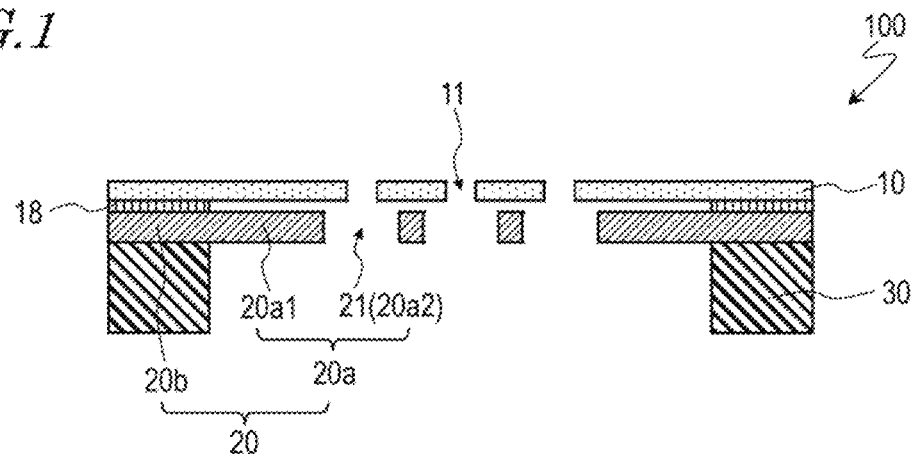
FIG. 1 is a cross-sectional view schematically showing a vapor deposition mask 100 in an embodiment according to the present invention, and shows a cross-section taken along line 1A-1A in FIG. 2.

Before describing embodiments of the present invention, a reason why film formation blur occurs in the case where a conventional layered mask is used will be described.

FIG. 16 and FIG. 17 are respectively a cross-sectional view and a plan view showing a vapor deposition mask 900 disclosed in Patent Document No. 1. FIG. 16 shows a cross-section taken along line 16A-16A in FIG. 17. As shown in FIG. 16 and FIG. 17, the vapor deposition mask 900 includes a resin film 910, a magnetic metal member 920 and a frame 930.

The resin film 910 is formed of a resin material such as polyimide or the like. The resin film 910 has a plurality of openings 911 formed therein in correspondence with a vapor deposition pattern.

The magnetic metal member 920 is sheet-like, and is formed of a magnetic metal material. The magnetic metal member 920 is layered on the resin film 910, and supports the resin film 910. In a vapor deposition step, the magnetic metal member 920 is attracted to a magnetic chuck located on a rear surface of a substrate that is an object on which vapor deposition is to be performed. As a result, the resin film 910 located between the magnetic metal member 920 and the substrate is closely contacted with the substrate. The magnetic metal member 920 has a plurality of slits (throughholes) 921, larger than the openings 911 of the resin film 910, formed therein so as to expose the openings 911 of the resin film 910.

The frame 930 is formed of a metal material. The frame 930 has a shape of a picture frame, and is secured to a peripheral portion of the magnetic metal member 920. The frame 930 supports the layered body of the resin film 910 and the magnetic metal member 920.

The vapor deposition mask 900 is produced as follows.

Figure 18:
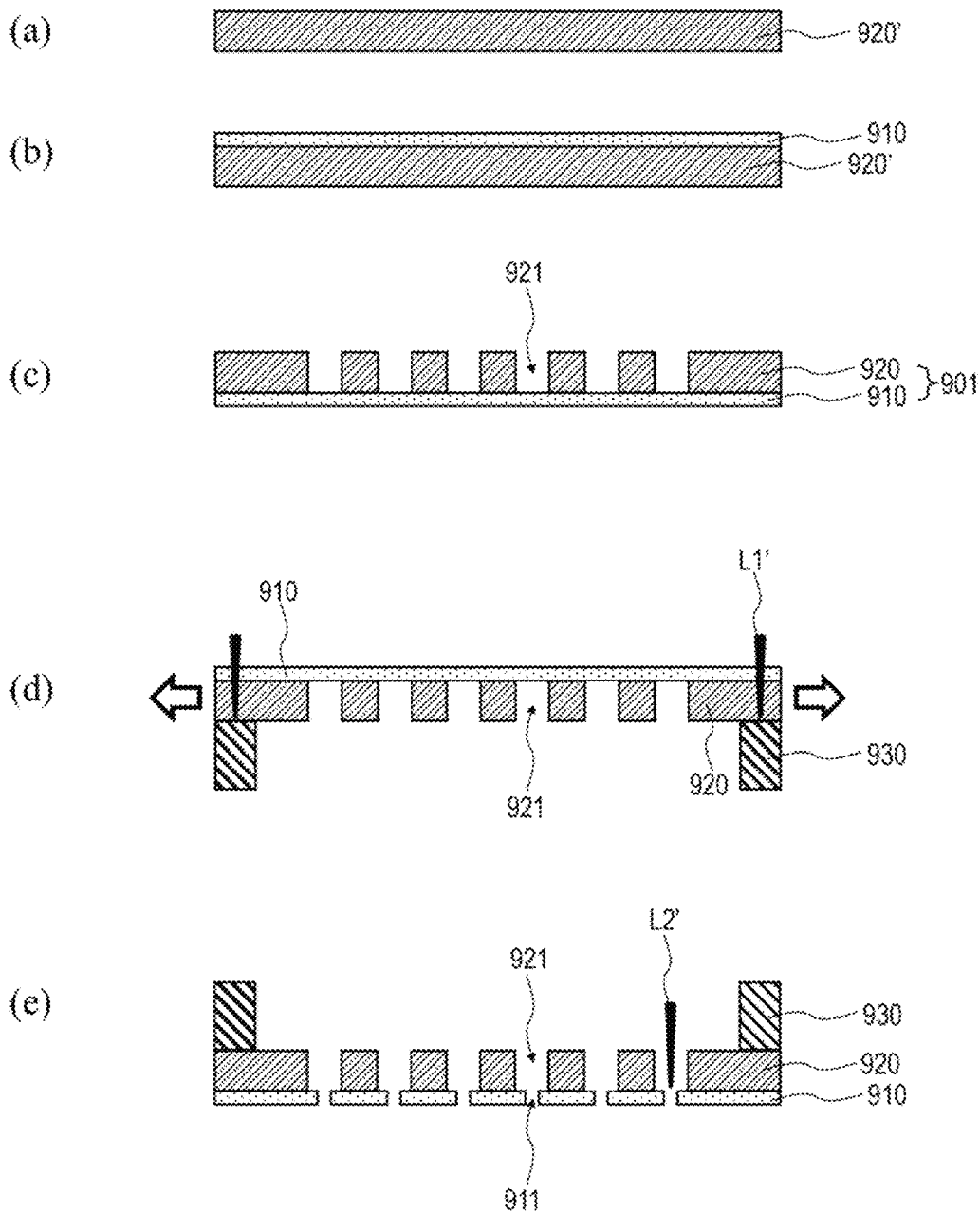
FIG. 18(a) through FIG. 18(e) are each a cross-sectional view showing a step of a method for producing the vapor deposition mask 900.

First, as shown in FIG. 18(a), a magnetic metal sheet 920' formed of a magnetic metal material is prepared.

Next, as shown in FIG. 18(b), a solution containing a resin material (or solution containing a precursor of a resin material) is applied to one surface of the magnetic metal sheet 920', and then a heat treatment (baking or curing) is performed to form the resin film 910 on the magnetic metal sheet 920'.

Then, as shown in FIG. 18(c), the plurality of slits 921 are formed in a predetermined region of the magnetic metal sheet 920' by a photolithography process. As a result, the magnetic metal member 920 including the plurality of slits 921 is formed. In this manner, a layered body 901 of the resin film 910 and the magnetic metal member 920 (hereinafter, the layered body will be referred to as a "mask body") is formed.

Next, as shown in FIG. 18(d), the mask body 901 is extended over the frame 930 while tension is applied on the mask body 901 in a layer plane direction(s) (referred to as a "tensioning step"), and the frame 930 is secured to the peripheral portion of the magnetic metal member 920 in this state. The frame 930 is secured by irradiating with a laser beam L1' to weld the peripheral portion of the magnetic metal member 920 and the frame 930 to each other.

Then, as shown in FIG. 18(e), the plurality of openings 911 are formed in a predetermined region of the resin film 910. The openings 911 are formed by irradiation with a laser beam L2' (namely, by laser processing). In this step, the processing object (the mask body 901 secured to the frame 930) is put upside down such that the laser beam L2' is directed downward. As a result, the vapor deposition mask 900 is produced.

As described above, in the case where the vapor deposition mask 900 is used to perform the vapor deposition step, film formation blur (also referred to as "after-shadow") may occur. One of causes of the film formation blur is that the frame 930 is deformed and as a result, a gap is made between the substrate and the vapor deposition mask 900. In the tensioning step in the method for producing the vapor deposition mask 900, tension needs to be applied on the mask body 901, which is the layered body of the resin film 910 and the magnetic metal member 920 (i.e., layered body including the layer of a metal material having a significantly higher Young's modulus than that of the resin material). Therefore, the tension to be supplied is necessarily very large. For this reason, the mask body 901 secured to the frame 930 receives large tension, and the frame 930 supporting the mask body 901 also receives a large stress in correspondence with the tension. As a result, the frame 930 is deformed.

Other causes of the film formation blur are sagging of the vapor deposition mask 900 due to the weight thereof, and the difference in the linear thermal expansion coefficient between the resin material forming the resin film 910 and the metal material forming the magnetic metal member 920.

By contrast, a vapor deposition mask in an embodiment according to the present invention has the following structure (in which the resin layer and the metal magnetic metal layer are independent from each other) (or which is produced by the method described below), and therefore, suppresses the film formation blur from occurring due to the above-described causes.

Hereinafter, embodiments according to the present invention will be described with reference to the drawings. The present invention is not limited to any of the following embodiments.

(Structure of the Vapor Deposition Mask)

Figure 2:
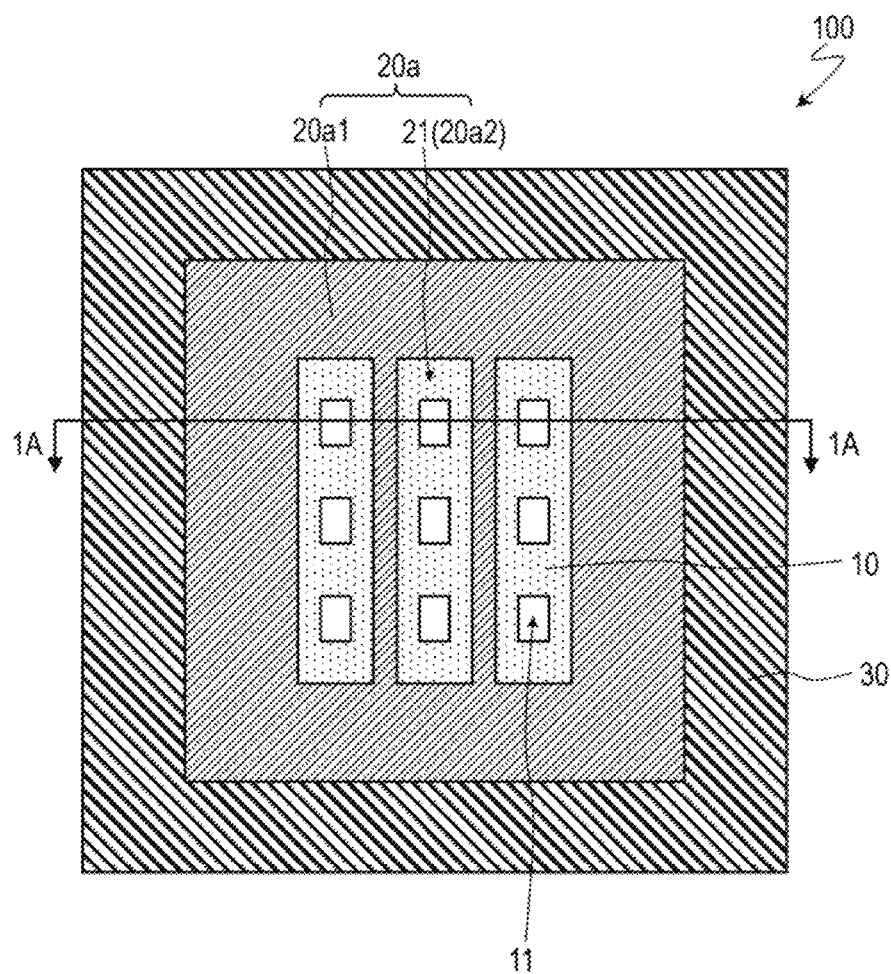
FIG. 2 is a plan view schematically showing the vapor deposition mask 100.

With reference to FIG. 1 and FIG. 2, a structure of a vapor deposition mask 100 in an embodiment according to the present invention will be described. FIG. 1 and FIG. 2 are respectively a cross-sectional view and a plan view schematically showing the vapor deposition mask 100. FIG. 1 shows a cross-section taken along line 1A-1A in FIG. 2. FIG. 1 and FIG. 2 schematically show an example of the vapor deposition mask 100. Needless to say, none of, for example, the sizes of, the numbers of, the relative positions of, and the ratio between lengths of, the components is limited to those shown in the figures. This is applicable to the other figures referred to below.

As shown in FIG. 1 and FIG. 2, the vapor deposition mask 100 includes a resin layer 10, a magnetic metal layer 20 and a frame 30. As described below, when the vapor deposition mask 100 is used to perform a vapor deposition step, the vapor deposition mask 100 is located such that the magnetic metal layer 20 is closer to a vapor deposition source and the resin layer 10 is closer to a work (object on which the vapor deposition is to be performed).

The resin layer 10 includes a plurality of openings 11. The plurality of openings 11 are formed to have a size and a shape corresponding to, and are located at positions corresponding to, a vapor deposition pattern that is to be formed on the work. In the example shown in FIG. 2, the plurality of openings 11 are located in a matrix.

It is preferred that the resin layer 10 is formed of, for example, polyimide. Polyimide is high in strength, chemical resistance and thermal resistance. The resin layer may be formed of another resin material, for example, polyethyleneterephthalate (PET) or the like.

There is no specific limitation on the thickness of the resin layer 10. It should be noted that if the resin layer 10 is too thick, a part of a vapor deposition film may be thinner than a desired thickness (referred to as "shadowing"). A reason why shadowing occurs will be described below in detail. From the point of view of suppressing the occurrence of shadowing, it is preferred that the resin layer 10 has a thickness of 25 μm or less. From the point of view of the strength and the resistance against cleaning of the resin layer 10 itself, it is preferred that the resin layer 10 has a thickness of 3 μm or greater.

The magnetic metal layer 20 is formed to overlap the resin layer 10. The magnetic metal layer 20 includes a mask portion 20a and a peripheral portion 20b located so as to enclose the mask portion 20a.

The mask portion 20a has such a shape as to expose the plurality of openings 11 of the resin layer 10. In this example, the mask portion 20a has a plurality of slits (through-holes) 21 formed therein. In the example shown in FIG. 2, a plurality of slits 21 extending in a column direction are arrayed in a row direction. As seen in a direction normal to the vapor deposition mask 100, each of the slits 21 is larger than each of the openings 11 of the resin layer 10, and at least one opening 11 (a plurality of openings 11 in this example) is located in each of the slits 21. In this specification, a region 20a1 of the mask portion 20a where the metal film is present may be referred to as a "solid portion", and a region 20a2 of the mask portion 20a where the metal film is not present (in this example, the region of the slits 21) may be referred to as "hollow portion".

The magnetic metal layer 20 may be formed of any of various magnetic metal materials. From the point of view of suppressing the vapor deposition mask from being warped in the vapor deposition step, it is preferred to use a magnetic metal material having a small linear thermal expansion coefficient αM (specifically, less than 6 ppm/° C.). For example, an Fe—Ni-based alloy (invar), an Fe—Ni—Co-based alloy or the like is preferably usable.

There is no specific limitation on the thickness of the magnetic metal layer 20. It should be noted that if the magnetic metal layer 20 is too thick, the magnetic metal layer 20 may sag due to the weight thereof or shadowing may occur. From the point of view of suppressing the magnetic metal layer 20 from sagging due to the weight thereof or suppressing the occurrence of shadowing, it is preferred that the magnetic metal layer 20 has a thickness of 100 μm or less. If the magnetic metal layer 20 is too thin, an attracting force provided by a magnetic chuck in the vapor deposition step described below may be decreased, which may form a gap between the vapor deposition mask 100 and the work. In addition, the magnetic metal layer 20 may be broken or deformed, in which case, it may be difficult to handle the magnetic metal layer 20. Therefore, it is preferred that the magnetic metal layer 20 has a thickness of 5 μm or greater.

The frame 30 has a shape of a picture frame, and is secured to the peripheral portion 20b of the magnetic metal layer 20. Namely, a region of the magnetic metal layer 20 that does not overlap the frame 30 is the mask portion 20a, and a region of the magnetic metal layer 20 that overlaps the frame 30 is the peripheral portion 20b. The frame 30 is formed of, for example, a metal material. The frame 30 may be formed of the same magnetic metal material as that of the magnetic metal layer 20.

As shown in FIG. 1, in the vapor deposition mask 100 in this embodiment, the resin layer 10 is not joined to the mask portion 20a of the magnetic metal layer 20 but is joined to at least a part of (typically, a part of) the peripheral portion 20b of the magnetic metal layer 20. In the structure shown in FIG. 1, the vapor deposition mask 100 further includes a metal film 18 located between the peripheral portion 20b of the magnetic metal layer 20 and the resin layer 10 and fixed to the resin layer 10. The metal film 18 is welded to the peripheral portion 20b of the magnetic metal layer 20, and the resin layer 10 is joined to the magnetic metal layer 20 via the metal film 18.

The magnetic metal layer 20 does not receive tension in a layer plane direction(s) from the frame 30. By contrast, the resin layer 10 receives tension in the layer plane direction(s) from the frame 30 and the magnetic metal layer 20. As described below, in the tensioning step, the resin layer 10 is secured to the magnetic metal layer 20 while being stretched in a predetermined layer plane direction(s) by a tensioning machine (or a tension welding machine also having a welding function). Therefore, the resin layer 10 receives the tension applied in the tensioning step from the frame 30 and the magnetic metal layer 20. By contrast, the magnetic metal layer 20 is secured to the frame with no external tension applied thereon in the layer plane direction(s). Therefore, the magnetic metal layer 20 is considered not to substantially receive the tension in the layer plane direction(s) from the frame 30 at least at room temperature.

In the vapor deposition mask 900 disclosed in Patent Document No. 1, as can be easily understood from the production method described above with reference to FIG. 18, the resin film 910 and the magnetic metal member 920 are joined to each other in the entirety thereof. Namely, in such a conventional layered mask, a layered body (mask body) of a resin layer and a magnetic metal layer is considered as being formed as an integral composite member. Therefore, it is necessary to apply tension on the mask body including the magnetic metal layer in the tensioning step. Thus, the tension to be applied is inevitably large, which deforms the frame.

By contrast, in the vapor deposition mask 100 in an embodiment according to the present invention, the resin layer 10 is not joined to the mask portion 20a of the magnetic metal layer 20, but is joined to at least a part of the peripheral portion 20b of the magnetic metal layer 20 as described above. Therefore, the vapor deposition mask 100 is considered to have a structure in which the magnetic metal layer 20 and the resin layer 10 are independent from each other except for the peripheral portion 20b. For this reason, the above-described structure in which the resin layer 10 receives tension in the layer plane direction(s) from the frame 30 and the magnetic metal layer 20 whereas the magnetic metal layer 20 does not receive any tension in the layer plane direction(s) is realized. This prevents the frame 30 from being deformed. Thus, in the vapor deposition step performed by use of the vapor deposition mask, film formation blur is suppressed from occurring.

In the case where the tension is applied on the resin layer and the magnetic metal layer at the same time (namely, in the case where the resin layer and the magnetic metal layer are pulled at the same time) in the tensioning step as conventionally done, unless the magnitude of the tension is controlled precisely, the solid portion of the magnetic metal layer may overlap the region of the resin layer where the openings are to be formed. By contrast, in the vapor deposition mask 100 in this embodiment, it is not necessary to apply any tension on the magnetic metal layer 20. Therefore, such a problem is prevented. In the case where, for example, the hollow portion 20a2 (slits 21) of the magnetic metal layer 20 are to be formed by a photolithography process, the hollow portion 20a2 may be positioned at the precision of the photolithography process.

In addition, in the vapor deposition mask 100 in this embodiment, the tension needs to be applied merely on the resin layer 10 in the tensioning step. The Young's modulus of a resin material is significantly lower than the Young's modulus of a metal material. Therefore, the tension to be applied on the resin layer 10 by the tensioning machine may be significantly smaller than conventionally needed. This allows the tension to be controlled easily in the tensioning step.

In the case where the mask body is formed as an integral composite member like in the conventional layered mask, the difference in the linear thermal expansion coefficient between the resin material forming the resin layer and the metal material forming the magnetic metal layer causes a thermal stress, which warps the mask body. By contrast, the vapor deposition mask 100 in this embodiment has a structure in which the magnetic metal layer 20 and the resin layer 10 are independent from each other except for the peripheral portion 20b. Therefore, such a warp is prevented. Thus, the film formation blur, which would be caused by the difference in the linear thermal expansion coefficient between the resin material and the metal material, is suppressed from occurring.

In the case where the mask body is formed as an integral composite member like in the conventional layered mask, the amount of sagging of the mask due to the weight thereof is increased for a reason described below in detail. By contrast, the vapor deposition mask 100 in this embodiment has a structure in which the magnetic metal layer 20 and the resin layer 10 are independent from each other except for the peripheral portion 20b. Therefore, such an increase in the amount of sagging is suppressed. Thus, the film formation blur, which would be caused by the sagging of the mask due to the weight thereof, is also suppressed from occurring.

In the vapor deposition mask 100 in this embodiment, the resin layer 10 is joined only to the peripheral portion 20b of the magnetic metal layer 20. Therefore, the resin layer 10 is easily separable from the magnetic metal layer 20. Thus, in the case where the resin layer 10 is deteriorated as a result of being repeatedly cleaned (in order to remove the vapor deposition material deposited on a surface of the vapor deposition mask 100 at the time of vacuum vapor deposition), the resin layer 10 may be replaced, so that the magnetic metal layer 20 and the frame 30 are reused.

It is preferred that the tension to be received by the resin layer 10 is set such that the amount of elastic deformation of the resin layer 10 caused by the tension is larger than, or equal to, the amount of thermal expansion of the resin layer 10 caused by a temperature rise in the vapor deposition step. The tension to be received by the resin layer 10 may be set to such a level, so that the thermal expansion of the resin layer 10 is counteracted by the elastic deformation supplied to the resin layer 10 in advance. Thus, the positions of the openings 11 are prevented from being shifted due to the thermal expansion of the resin layer 10. In the case where, for example, the temperature rise in the vapor deposition step (rise from room temperature) is assumed to be 1° C. or less, it is sufficient that the tension to be received by the resin layer 10 is set such that the amount of elastic deformation of the resin layer 10 is larger than, or equal to, the amount of thermal expansion of the resin layer 10 caused when there is a temperature rise of 1° C.

As described above, the vapor deposition mask 100 in this embodiment allows the tension to be applied on the resin layer 10 by the tensioning machine to be significantly smaller than conventionally needed. Therefore, the amount of elastic deformation to be supplied to the resin layer 10 in advance may be easily set to be relatively large. Namely, the vapor deposition mask 100 in this embodiment acts property to a large temperature rise. For example, the tension to be received by the resin layer 10 may be set to be larger than, or equal to, the amount of thermal expansion caused when there is a temperature rise of 20° C. In this case, even if the temperature rise in the vapor deposition step is of 20° C., the positions of the openings 11 are prevented from being shifted. Therefore, even in the case where a relatively low-cost vapor deposition device that does not sufficiently suppress the temperature rise at the time of vapor deposition is used, the vapor deposition pattern is formed with high precision.

From the point of view of suppressing the thermal stress from occurring in the vapor deposition step, it is preferred that the linear thermal expansion coefficient $\alpha M$ of the material forming the magnetic metal layer 20 and the linear thermal expansion coefficient $\alpha F$ of the material forming the frame 30 are as close as possible. Specifically, it is preferred that the relationship of $0.5\ \alpha M \leq \alpha F \leq 2.0\ \alpha M$ is satisfied. It is more preferred that the relationship of $0.8\ \alpha M \leq \alpha F \leq 1.2\ \alpha M$ is satisfied. It is still more preferred that $\alpha M = \alpha F$ (namely, the magnetic metal layer 20 and the frame 30 are formed of the same material as each other).

(Method for Producing the Vapor Deposition Mask)

With reference to FIG. 3(a) through FIG. 3(g), an example of method for producing the vapor deposition mask 100 will be described. FIG. 3(a) through FIG. 3(g) are each a cross-sectional view showing a step of the method for producing the vapor deposition mask 100.

First, as shown in FIG. 3(a), a magnetic metal plate formed of a magnetic metal material is provided as the magnetic metal layer 20. As the material of the magnetic metal layer 20, invar (Fe—Ni-based alloy containing about 36% by weight of Ni), for example, is preferably usable.

Next, as shown in FIG. 3(b), the magnetic metal layer 20 is processed so as to include a mask portion 20a including the solid portion 20a1 and the hollow portion 20a2 and also to include the peripheral portion 20b located so as to enclose the mask portion 20a. Specifically, the plurality of slits 21 are formed in the magnetic metal layer 20 by a photolithography process.

Next, as shown in FIG. 3(c), the frame 30 is secured to the peripheral portion 20b of the magnetic metal layer 20 (namely, to a part of the magnetic metal layer 20). This step is performed in a state where no external tension is applied on the magnetic metal layer 20 in the layer plane direction(s). Specifically, the frame 30 is put on the peripheral portion 20b of the magnetic metal layer 20, and the peripheral portion 20b and the frame 30 are joined to each other. It is preferred that the frame 30 is formed of, for example, invar. In this example, the peripheral portion 20b of the magnetic metal layer 20 and the frame 30 are welded to each other by irradiating with a laser beam L1 from the magnetic metal layer 20 side. In this example, spot welding is performed at a plurality of positions with a predetermined interval. The pitch of the spot welding may be appropriately set. For the welding, a YAG laser, for example, is usable. The laser beam L1 has a wavelength and an energy per pulse of, for example, 1064 nm and 7 J/pulse. The welding conditions are not limited to those described herein as examples, needless to say.

Separately from the steps shown in FIG. 3(a) through FIG. 3(c), as shown in FIG. 3(d), a resin sheet formed of a resin material is provided as the resin layer 10. As the material of the resin layer 10, polyimide, for example, is preferably usable.

Next, as shown in FIG. 3(e), the metal film 18 is formed as being fixed to the resin layer 10. The metal film 18 is formed in a shape of a picture frame in a region that will overlap the peripheral portion 20b of the magnetic metal layer 20 later. The metal film 18 may be formed by, for example, electrolytic plating, electroless plating or the like. The metal film 18 may be formed of any of various materials. For example, Ni, Cu or Sn is preferably usable. The metal film 18 may have any thickness with which the metal film 18 may withstand the welding to the magnetic metal layer 20. The metal film 18 has a thickness of, for example, 1 μm or greater and 100 μm or less.

Figure 4:
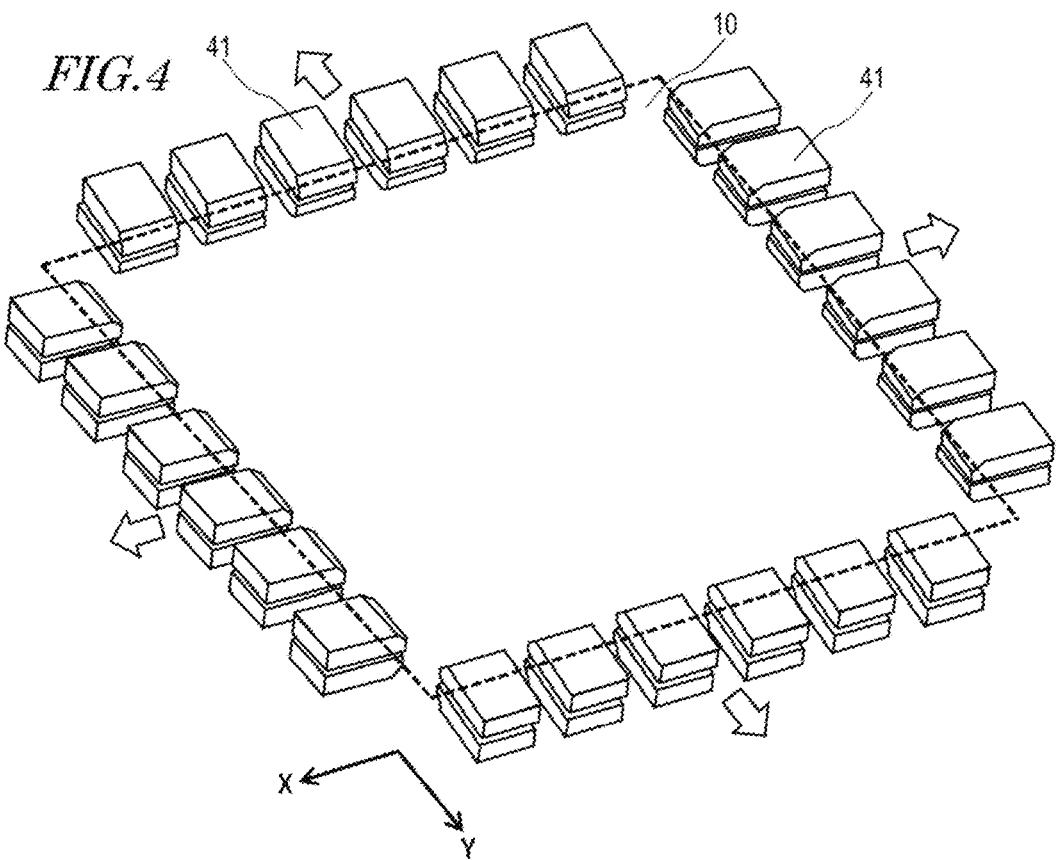
FIG. 4 is an isometric view showing how a resin layer 10 is held by clamps 41 of a tension welding machine.
Figure 5:
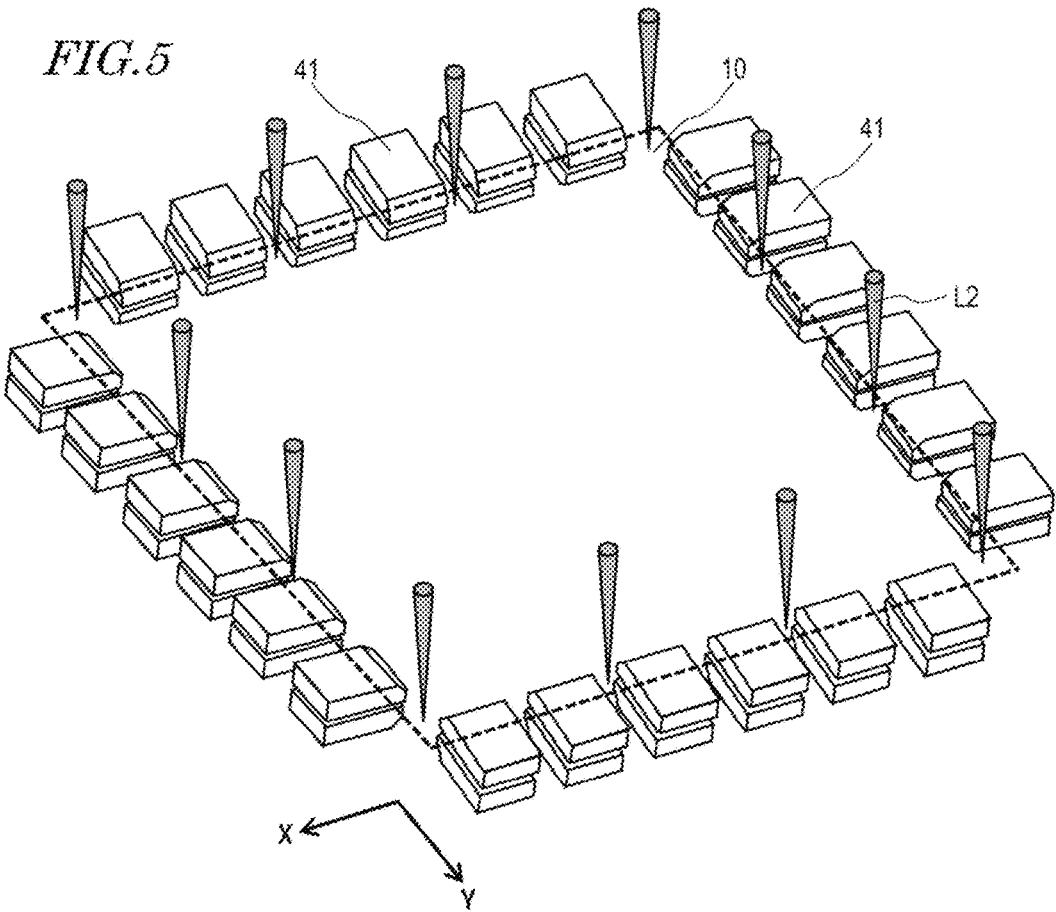
FIG. 5 is an isometric view showing how spot welding is performed in a state where the resin layer 10 is held by the clamps 41.

Next, as shown in FIG. 3(f), the resin layer 10 is joined to the magnetic metal layer 20. This step is performed such that the resin layer 10 is not joined to the mask portion 20a of the magnetic metal layer 20 but is joined to at least a part of the peripheral portion 20b of the magnetic metal layer 20. This step is performed in a state where external tension is applied on the resin layer 10 in the layer plane direction(s). Specifically, first, the frame joined to the magnetic metal layer 20 is secured to a tension welding machine. Next, the resin layer 10 is placed on the magnetic metal layer 20 with the metal film 18 being directed downward. Next, two facing edges of the resin layer 10 (edges perpendicularly crossing a first direction X in the figure) are held by a holding portion (clamps) of the tension welding machine, and a certain tension is applied in a direction parallel to the first direction X. At the same time, two edges perpendicularly crossing a second direction Y perpendicularly crossing the first direction X (namely, edges parallel to the first direction X) are also held by the clamps, and a certain tension is applied in a direction parallel to the second direction Y. FIG. 4 shows how the resin layer 10 is held by clamps 41 of the tension welding machine. As shown in FIG. 4, each of the edges (each of sides) of the resin layer 10 is held by the plurality of clamps 41. The tension to be applied on the resin layer 10 in this step is set such that the amount of elastic deformation of the resin layer 10 caused by the tension is larger than, or equal to, the amount of thermal expansion of the resin layer 10 caused by a temperature rise in the vapor deposition step (e.g., 1° C.). Next, the metal film 18 is welded to the magnetic metal layer 20 by irradiating with a laser beam L2 from the resin layer 10 side. In this example, spot welding is performed at a plurality of positions with an interval. FIG. 5 shows how the spot welding is performed in a state where the resin layer 10 is held by the clamps 41 (the metal film 18 is not shown). The number of the positions where the spot welding is performed is not limited to the number shown in FIG. 5. The number of the positions where the spot welding is performed, and the pitch between the positions, may be appropriately selected. The metal film 18 is welded to the magnetic metal layer 20, and as a result, the resin layer 10 is joined to the magnetic metal layer 20 via the metal film 18.

Next, as shown in FIG. 3(g), the plurality of openings 11 are formed in the resin layer 10. In this step, the plurality of openings 11 are formed in a region of the resin layer 10 corresponding to the hollow portion 20a2 of the mask portion 20a. The openings 11 may be formed by, for example, laser processing. For the laser processing, a pulse laser is used. In this example, a YAG laser is used, and a predetermined region of the resin layer 10 is irradiated with a laser beam L3 having a wavelength of 355 nm. In this step, the processing object (structural body including the frame 30, the magnetic metal layer 20 and the resin layer 10) is put upside down such that the laser beam L3 is directed downward. The laser beam L3 has an energy density of, for example, 0.5 J/cm$^2$. The laser processing is performed by focusing the laser beam L3 at a surface of the resin layer 10 and providing a plurality of shots. The number of shots is determined in accordance with the thickness of the resin layer 10. The shot frequency is set to, for example, 60 Hz. The conditions for the laser processing are not limited to the above-described conditions, and may be appropriately selected such that the resin layer 10 may be processed. In this manner, the vapor deposition mask 100 is produced.

According to the above-described production method, after the frame 30 is secured to a part of the magnetic metal layer 20, the resin layer 10 is joined to the magnetic metal layer 20. The step of joining the resin layer 10 is performed such that the resin layer 10 is not joined to the mask portion 20a of the magnetic metal layer 20 but is joined to at least a part of the peripheral portion 20b of the magnetic metal layer 20. Therefore, the vapor deposition mask 100 having a structure in which the magnetic metal layer 20 and the resin layer 10 are independent from each other except for the peripheral portion 20b is produced. For this reason, the tension to be applied on the resin layer 10 and the tension to be applied on the magnetic metal layer 20 are set independently from each other. Thus, as described above as an example, the step of securing the frame 30 to a part of the magnetic metal layer 20 may be performed in a state where no external tension is applied on the magnetic metal layer 20 in the layer plane direction(s), whereas the step of joining the resin layer 10 to the magnetic metal layer 20 may be performed in a state where external tension is applied on the resin layer 10 in the layer plane direction(s). This prevents the frame 30 from being deformed, and thus the resultant vapor deposition mask 100 suppresses film formation blur from occurring.

According to the production method in this embodiment, the tension needs to be applied merely on the resin layer 10. Therefore, the tension to be applied on the resin layer 10 by the tension welding machine may be significantly smaller than conventionally needed. A test calculation on the tension to be applied in the tensioning step was made as compared with in the case where a conventional layered mask would be used. The results will be described.

Table 1 shows the material, thickness, linear thermal expansion coefficient, Young's modulus and Poisson's ratio of each of the magnetic metal layer and the resin layer assumed for the test calculation. As shown in Table 1, in this example, invar is used as the material of the magnetic metal layer, and polyimide is used as the material of the resin layer.

TABLE 1

|  | MATERIAL | THICKNESS | LINEAR THERMAL EXPANSION COEFFICIENT [ppm/° C.] | YOUNG'S MODULUS [GPa] | POISSON'S RATIO |
|---|---|---|---|---|---|
| MAGNETIC METAL LAYER | INVAR | 15 μm | 1.2 | 140-150 | 0.22 |
| RESIN LAYER | POLYIMIDE | 5 μm | 4 | 3 | 0.29-0.30 |

Regarding a conventional layered mask, the amount of thermal expansion and the amount of elastic deformation were calculated. The results are shown in Table 2 and Table 3.

TABLE 2

CALCULATION RESULTS OF THE AMOUNT OF THERMAL EXPANSION: CONVENTIONAL

| REFERENCE LENGTH [mm] | TEMPERATURE RISE ΔT [° C.] | LINEAR THERMAL EXPANSION COEFFICIENT [ppm/° C.] | AMOUNT OF THERMAL EXPANSION [μm] |
|---|---|---|---|
| 100 | 30 | 3 | 9 |

TABLE 3

CALCULATION RESULTS OF THE AMOUNT OF ELASTIC DEFORMATION: CONVENTIONAL

| REFERENCE LENGTH [mm] | TENSILE FORCE [N] | CROSS-SECTIONAL AREA [mm$^2$] | YOUNG'S MODULUS [GPa] | AMOUNT OF ELASTIC DEFORMATION [μm] |
|---|---|---|---|---|
| 99.991 | 90 | 7.1 | 140.0 | 9 |

In the conventional layered mask, the resin layer and the magnetic metal layer may be regarded as an integral composite member. Therefore, the linear thermal expansion coefficient of the entirety of the layered body (mask body) of the resin layer and the magnetic metal layer is assumed to be 3 ppm/° C. Where the reference length is 100 mm and the temperature rise in the vapor deposition step is 30° C., the amount of thermal expansion of the layered body (amount of expansion in a state where the layered body is not held by the frame) is 9 μm (see Table 2).

Therefore, where the size of the finished vapor deposition mask is 100%, the mask body is produced with a size corresponding to 99.991% (=100/(100+0.009)) (i.e., reduction ratio: 99.991%), and the mask body is secured to the frame while being stretched so as to have a size of 100%. The tension at this point is 90 N where the Young's modulus of the entirety of the mask body is 140 GPa (see Table 3). Therefore, with the conventional layered mask, in order to counterpart the thermal expansion, caused by the temperature rise of 30° C., by the elastic deformation caused by the tension, tension of 90 N needs to be applied on the mask body.

Regarding the vapor deposition mask 100 in this embodiment, the amount of thermal expansion and the amount of elastic deformation were calculated. The results are shown in Table 4 and Table 5.

TABLE 4

CALCULATION RESULTS OF THE AMOUNT OF THERMAL EXPANSION: EMBODIMENT OF THE PRESENT INVENTION

| REFERENCE LENGTH [mm] | TEMPERATURE RISE ΔT [° C.] | LINEAR THERMAL EXPANSION COEFFICIENT [ppm/° C.] | AMOUNT OF THERMAL EXPANSION [μm] |
|---|---|---|---|
| 100 | 30 | 4 | 12 |

TABLE 5

CALCULATION RESULTS OF THE AMOUNT OF ELASTIC DEFORMATION: EMBODIMENT OF THE PRESENT INVENTION

| REFERENCE LENGTH [mm] | TENSILE FORCE [N] | CROSS-SECTIONAL AREA [mm$^2$] | YOUNG'S MODULUS [GPa] | AMOUNT OF ELASTIC DEFORMATION [μm] |
|---|---|---|---|---|
| 99.991 | 2.5 | 7.1 | 3.0 | 12 |

In the vapor deposition mask 100 in this embodiment, the tension needs to be applied merely on the resin layer 10 formed of polyimide. Therefore, as can be seen from Table 4 and Table 5, the tension required to match the amount of elastic deformation and the amount of thermal expansion to each other is 2.5 N. As can be seen, in an embodiment according to the present invention, the tension needed in the tensioning step may be significantly decreased. Therefore, the frame 30 may be less rigid than, and may also be thinner than, in the conventional case. Since the frame is thinner, the vapor deposition mask 100 is more lightweight and easier to handle.

Now, a reason why the conventional layered mask, in which the mask body is formed as a composite member, is warped significantly will be described.

Figure 19:
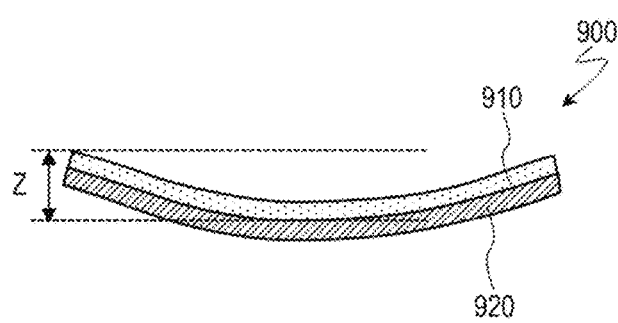
FIG. 19 is a cross-sectional view showing that the vapor deposition mask 900 is warped.

As shown in FIG. 19, in the conventional vapor deposition mask 900, the mask body is warped due to a thermal stress caused by the difference in the linear thermal expansion coefficient between the resin material forming the resin layer 910 and the metal material forming the magnetic metal layer 920. The warp amount at this point is set as Z (μm). In the case where an organic EL display device is produced by a production method including the vapor deposition step performed by use of the vapor deposition mask 900, the length of a diagonal line of an active area (active area length)

is set to $L_{AA}$. In this case, the warp amount Z per active area length $L_{AA}$ when the temperature rises by 1° C. is expressed by the following expression (1). In expression (1), d1, Y and p are respectively the average thickness (μm), the Young's modulus (GPa) and the Poisson's ratio of the magnetic metal member 920 formed of invar (linear thermal expansion coefficient: 1.2 ppm/° C.). In expression (1), 6 and d2 are respectively the residual stress (tensile stress) and the average thickness (μm) of the resin layer 910 formed of polyimide (linear thermal expansion coefficient: 3 ppm/° C.). The residual stress of the polyimide layer is expressed by a sum of the thermal stress and the intrinsic stress. The thermal stress is caused, while a precursor of polyimide imidized at high temperature is being cooled to room temperature, by the difference in the thermal expansion coefficient between a member supporting the polyimide layer and polyimide. Since the polyimide layer has a small intrinsic stress, the residual stress is mostly a thermal stress.

[Expression 1]

$$Z = \sigma * d2 * 3 * (L_{AA})^2 / (Y/1-p) * d1^2 \quad (1)$$

As described above, the slits 921 and the openings 911 are respectively formed in the magnetic metal member 920 and the resin layer 910. Assuming that the formation of the slits 921 results in the average thickness d1 of the magnetic metal member 920 being changed from 20 μm to 5.2 μm and the formation of the openings 911 results in the average thickness d2 of the resin layer 910 being changed from 6 μm to 4.6 μm, the warp amount Z is about ten times the warp amount in the case where neither the slits 921 nor the openings 911 are formed, as can be seen from expression (1).

As described above, in the conventional vapor deposition mask 900, the mask body is warped and also the warp amount Z is larger than the warp amount of a simple composite material (layered body of a resin layer with no opening and a magnetic metal layer with no slit). The Young's modulus of an area corresponding to the active area of the mask body (area where the openings 911 and the slits 921 are present) is lower than that in the other area (where at least the openings 911 are absent). Therefore, when tension is applied on the mask body, the amount of strain is increased, and the amount of sagging due to the weight is increased.

By contrast, the vapor deposition mask 100 in this embodiment has a structure in which the magnetic metal layer and the resin layer 10 having different properties are independent from each other except for the peripheral portion 20b (namely, a structure in which the mask portion 20a of the magnetic metal layer 20 and the resin layer 10 are not joined to each other). Therefore, film formation blur, which would be caused by the difference in the linear thermal expansion coefficient between the resin material forming the resin layer 910 and the metal material forming the magnetic metal member 920 or by the sagging of the mask due to the weight thereof, is suppressed from occurring.

In this example, before the frame 30 is secured to the magnetic metal layer 20, the slits 21 are formed in the magnetic metal layer 20. Alternatively, the slits 21 may be formed in the magnetic metal layer 20 by, for example, laser processing after the frame 30 is secured to the magnetic metal layer 20.

(Other Structures of the Vapor Deposition Mask)

Now, other structures of the vapor deposition mask in embodiments according to the present invention will be described.

FIG. 6(a) and FIG. 6(b) show a vapor deposition mask 100A in another embodiment according to the present invention. In the vapor deposition mask 100 shown in FIG. 1 and FIG. 2, a plurality of openings 11 of the resin layer 10 are located in each of the slits 21 of the magnetic metal layer 20. By contrast, in the vapor deposition mask 100A shown in FIG. 6(a) and FIG. 6(b), one opening 11 of the resin layer 10 is located in each of the slits 21 of the magnetic metal layer 20. As can be seen from this, it is sufficient that at least one opening 11 is located in each of the slits 21 of the magnetic metal layer 20.

FIG. 7(a) and FIG. 7(b) show a vapor deposition mask 100B in still another embodiment according to the present invention. In the vapor deposition mask 100 shown in FIG. 1 and FIG. 2, the mask portion 20a of the magnetic metal layer 20 includes the plurality of slits 21. By contrast, in the vapor deposition mask 100B shown in FIG. 7(a) and FIG. 7(b), the mask portion 20a of the magnetic metal layer 20 includes one slit (through-hole) 21. As can be seen from this, it is sufficient that at least one slit (through-hole) 21 is formed in the mask portion 20a of the magnetic metal layer 20.

A vapor deposition mask in an embodiment according to the present invention may have a structure in which unit regions U each corresponding to one device (e.g., organic EL display device) are arrayed two-dimensionally. The vapor deposition mask having such a structure is preferably usable to form a plurality of devices on one substrate.

FIG. 8(a) and FIG. 8(b) show a vapor deposition mask 100C in still another embodiment according to the present invention. The vapor deposition mask 100C shown in FIG. 8(a) and FIG. 8(b) includes a plurality of (four in this example) unit regions U arrayed with an interval as seen in a direction normal thereto. In each of the unit regions U, the resin layer 10 includes a plurality of openings 11, and the mask portion 20a of the magnetic metal layer 20 includes one slit (through-hole) 21. The number and the manner of positional arrangement of the unit regions U, the number and the manner of positional arrangement of the openings 11 of the resin layer 10 in each of the unit regions U, the number and the manner of positional arrangement of the slit(s) 21 of the magnetic metal layer 20 in each of the unit regions U, and the like are determined in accordance with the structure of the devices to be produced, and are not limited to those in the example shown in the figures.

The magnetic metal layer 20 does not need to be formed of one magnetic metal plate, and may be of a combination of a plurality of (e.g., two) magnetic metal plates. Namely, the magnetic metal layer 20 may be divided into a plurality of magnetic metal plates.

In the embodiments described above, the resin layer 10 is joined to the magnetic metal layer 20 via the metal film 18. An embodiment of the present invention is not limited to having such a structure.

FIG. 9(a) and FIG. 9(b) show a vapor deposition mask 100D in still another embodiment according to the present invention. In the vapor deposition mask 100D shown in FIG. 9(a) and FIG. 9(b), the resin layer 10 is joined to the peripheral portion 20b of the magnetic metal layer 20 via an adhesive layer 19. Namely, the resin layer 10 is bonded to the peripheral portion 20b of the magnetic metal layer 20. The adhesive layer 19 may be formed by, for example, applying an ultraviolet-curable adhesive to the peripheral portion 20b of the magnetic metal layer 20 in a shape of a picture frame and then irradiating the adhesive with ultraviolet light to cure the adhesive.

However, the structure in which the resin layer 10 is bonded to the magnetic metal layer 20 has a risk that the vapor deposition pattern is contaminated with gas released from the adhesive layer 19 by the heat in the vapor deposition step. Therefore, from the point of view of preventing the contamination of the vapor deposition pattern, it is preferred that the resin layer 10 is joined to the magnetic metal layer 20 via the metal film 18 welded to the peripheral portion 20b of the magnetic metal layer 20.

Figure 10:
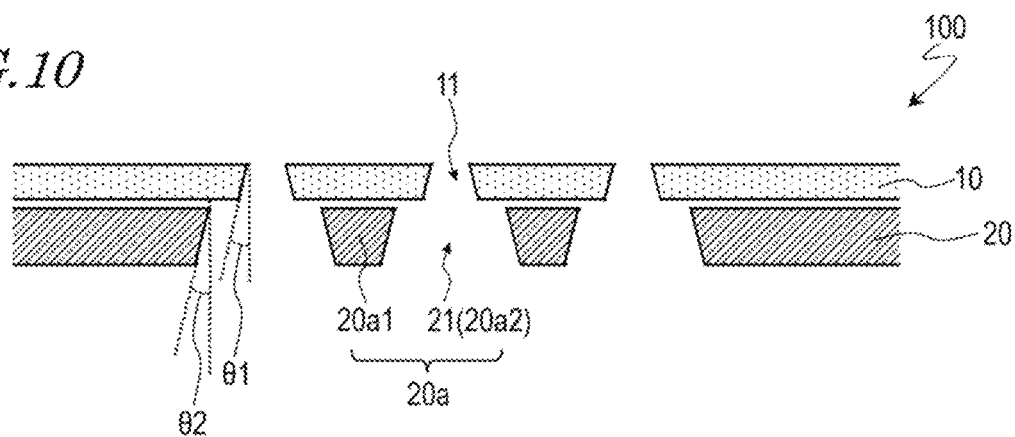
FIG. 10 is a cross-sectional view showing an example of another structure of the vapor deposition mask 100.

FIG. 10 shows an example of cross-sectional shape of the openings 11 of the resin layer 10 and the slits 21 of the magnetic metal layer 20. As shown in FIG. 10, it is preferred that the openings 11 and/or the slits 21 have a shape expanding toward a vapor deposition source. Namely, it is preferred that inner walls of the openings 11 and/or inner walls of the slits 21 are tapered (inclined with respect to the direction normal to the vapor deposition mask 100). In the case where the openings 11 and/or the slits 21 have such a shape, shadowing is suppressed from occurring. There is no specific limitation on a tapering angle $\theta1$ of each of the inner walls of the openings 11 (angle made by the direction normal to the vapor deposition mask 100 and each of the inner walls of the openings 11) or on a tapering angle $\theta2$ of each of the inner walls of the slits 21 (angle made by the direction normal to the vapor deposition mask 100 and each of the inner walls of the slits 21). For example, $\theta1$ and $\theta2$ are each 25 degrees or larger and 65 degrees or smaller.

Figure 11:
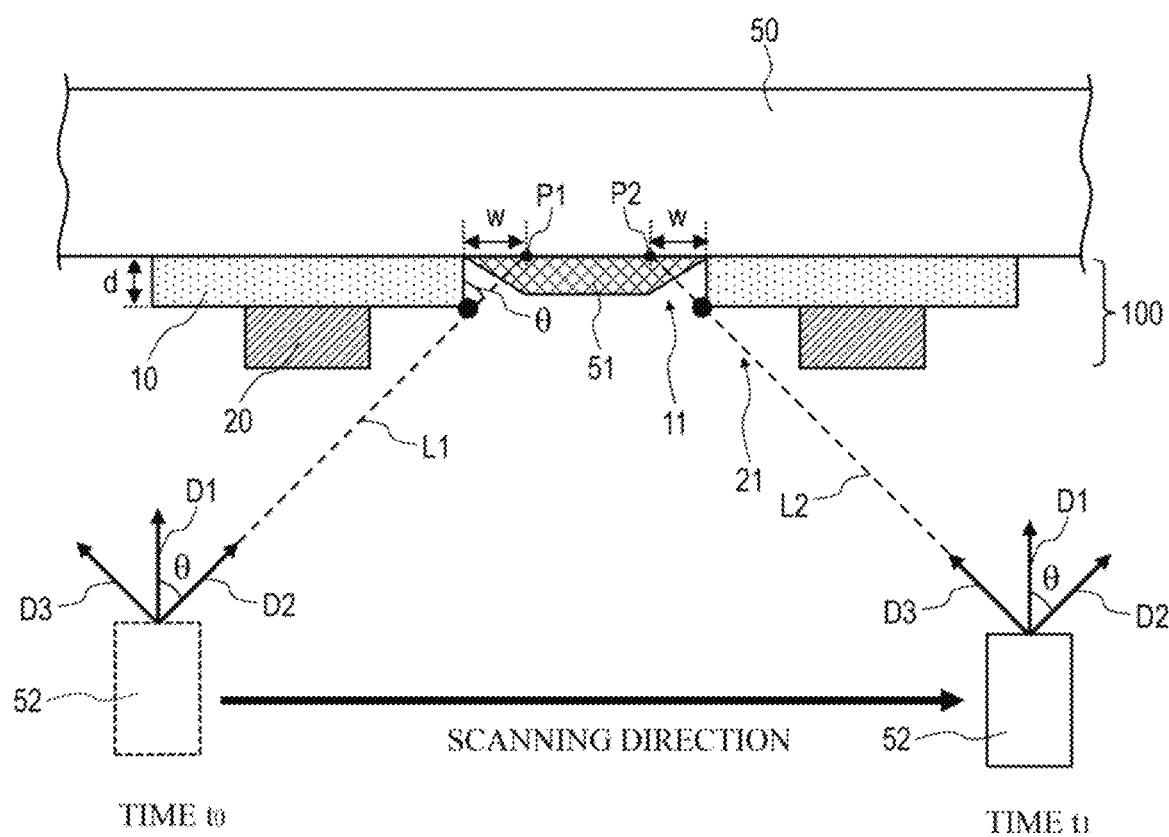
FIG. 11 schematically shows a vapor deposition step performed by use of the vapor deposition mask 100 in the case where inner walls of an opening 11 and a slit 21 are not tapered.
Figure 12:
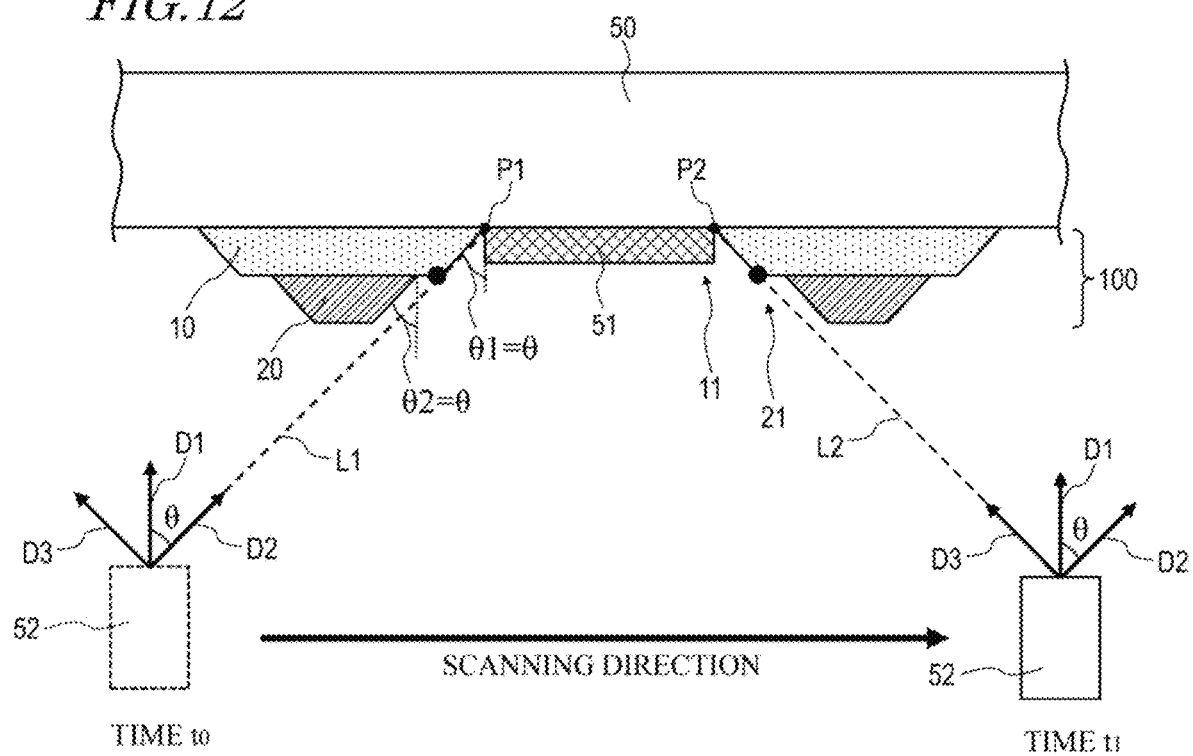
FIG. 12 schematically shows a vapor deposition step performed by use of the vapor deposition mask 100 in the case where the inner walls of the opening 11 and the slit 21 are tapered.

With reference to FIG. 11 and FIG. 12, a reason why the occurrence of shadowing is suppressed by the inner walls of the openings 11 and/or the slits 21 being tapered will be described in detail.

FIG. 11 and FIG. 12 each schematically show a vapor deposition step performed by use of the vapor deposition mask 100 (step of forming a vapor deposition film 51 on a substrate 50 provided as a work). FIG. 11 shows a case where the inner walls of the opening 11 and/or the slit 21 are not tapered (namely, are generally parallel to the direction normal to the vapor deposition mask 100). FIG. 12 shows a case where the inner walls of the opening 11 and/or the slit 21 are tapered.

In the examples shown in FIG. 11 and FIG. 12, a vapor deposition source 52 is moved from left to right with respect to the substrate 50 (namely, the scanning direction is from left to right) to perform vapor deposition. The vapor deposition material is released from the vapor deposition source 52 in the direction normal to the vapor deposition mask 100 and also in an oblique direction (direction inclining with respect to the direction normal to the vapor deposition mask 100). In this example, the expanding angle of the vapor deposition material is set as $\theta$. The direction normal to the vapor deposition mask 100 is set as D1, a direction inclining by $\theta$ in the scanning direction (i.e., rightward) with respect to the direction D1 is set as D2, and a direction inclining by $\theta$ in a direction opposite to the scanning direction (i.e., leftward) with respect to the direction D1 is set as D3. In the example shown in FIG. 12, the tapering angle $\theta1$ of the opening 11 and the tapering angle $\theta2$ of the slit 21 are the same as the expanding angle $\theta$ of the vapor deposition material.

FIG. 11 and FIG. 12 each show the position of the vapor deposition source 52 at the start (time $t_0$) of, and the position of the vapor deposition source 52 at the end (time $t_1$) of, a period in which the vapor deposition film 51 is deposited in one opening 11 of the resin layer 10. Time $t_0$ is when the vapor deposition material released from the vapor deposition source 52 starts arriving at the opening 11. At this point, a virtual straight line L1 extending from the vapor deposition source 52 in the direction D2 just passes an edge of the opening 11 closer to the deposition source 52. Time $t_1$ is when the arrival of the vapor deposition material, released from the vapor deposition source 52, at the opening stops. At this point, a virtual straight line L2 extending from the vapor deposition source 52 in the direction D3 just passes an edge of the opening 11 closer to the vapor deposition source 52.

In the example shown in FIG. 11, in a region from a point P1 at which the vapor deposition material arrives at time $t_0$ (intersection of the virtual straight line L1 and a surface of the substrate 50) to a point P2 at which the vapor deposition material arrives at time $t_1$ (intersection of the virtual straight line L2 and the surface of the substrate 50), the vapor deposition film 51 is formed to have a desired thickness. However, in a region outer thereto (a region from one end of the opening 11 in the scanning direction to the point P1 and a region from the other end of the opening 11 in the scanning direction to the point P2), the vapor deposition film 51 is thinner than the desired thickness. This portion (portion formed to be thinner than the desired thickness) is referred to as a "shadow" (may be referred to as an "inner shadow" as opposed to the "outer shadow"). The shadow has a width w expressed as $w = d \cdot \tan\theta$ using the thickness d of the resin layer 10 and the expanding angle $\theta$ of the vapor deposition material. Namely, the width w of the shadow is in proportion to thickness d of the resin layer 10.

By contrast, in the example shown in FIG. 12, the point P1 at which the vapor deposition material reaches at time $t_0$ and the point P2 at which the vapor deposition material reaches at time $t_1$ are respectively located at both of two ends of the opening 11 in the scanning direction. Therefore, the vapor deposition film 51 is entirely formed to have a desired thickness. Namely, no shadow is formed. In this manner, the inner walls of the openings 11 and/or the slits 21 are tapered, and thus, shadowing is suppressed from occurring.

(Method for Producing an Organic Semiconductor Device)

The vapor deposition mask 100 in an embodiment according to the present invention is preferably usable for a vapor deposition step in a method for producing an organic semiconductor device.

Hereinafter, the method for producing an organic EL display device, for example, will be described.

Figure 13:
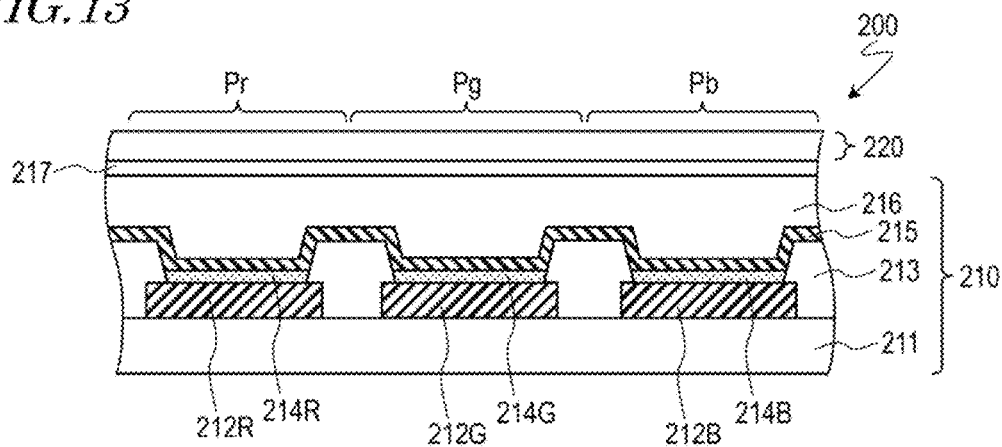
FIG. 13 is a cross-sectional view schematically showing an organic EL display device 200 of a top emission type.

FIG. 13 is a cross-sectional view schematically showing an organic EL display device 200 of a top emission type.

As shown in FIG. 13, the organic EL display device 200 includes an active matrix substrate (TFT substrate) 210 and a encapsulation substrate 220, and includes a red pixel Pr, a green pixel Pg and a blue pixel Pb.

The TFT substrate 210 includes an insulating substrate and a TFT circuit formed on the insulating substrate (neither is shown). A flattening film 211 is provided so as to cover the TFT substrate. The flattening film 211 is formed of an organic insulating material.

On the flattening film 211, lower electrodes 212R, 212G and 212B are provided. The lower electrodes 212R, 212G and 212B are respectively formed in the red pixel Pr, the green pixel Pg and the blue pixel Pb. The lower electrodes 212R, 212G and 212B are connected to the TFT circuit and each act as an anode. Between pixels adjacent to each other, a bank 213 covering ends of the lower electrodes 212R, 212G and 212B is provided. The bank 213 is formed of an insulating material.

On the lower electrodes 212R, 212G and 212B in the red pixel Pr, the green pixel Pg and the blue pixel Pb, organic EL layers 214R, 214G and 214B are respectively provided. The organic EL layers 214R, 214G and 214B each have a layered structure including a plurality of layers formed of an organic semiconductor material. The layered structure includes, for example, a hole injection layer, a hole transfer layer, a light emitting layer, an electron transfer layer and an electron injection layer in this order, with the hole injection layer being closest to the lower electrodes 212R, 212G and 212B. The organic EL layer 214R in the red pixel Pr includes a light emitting layer that emits red light. The organic EL layer 214G in the green pixel Pg includes a light emitting layer that emits green light. The organic EL layer 214B in the blue pixel Pb includes a light emitting layer that emits blue light.

On the organic EL layers 214R, 214G and 214B, an upper electrode 215 is provided. The upper electrode 215 is formed of a transparent conductive material and is provided so as to be continuous in the entirety of a display region (i.e., so as to common to the red pixel Pr, the green pixel Pg and the blue pixel Pb), and acts as a cathode. On the upper electrode 215, a protective layer 216 is provided. The protective layer 216 is formed of an organic insulating material.

The above-described structure of the TFT substrate 210 is encapsulated by the encapsulation substrate bonded to the TFT substrate 210 with a transparent resin layer 217.

The organic EL display device 200 may be produced as follows by use of the vapor deposition mask 100 (or any of the vapor deposition masks 100A through 100D) in an embodiment according to the present invention. FIG. 14(a) through FIG. 14(d) and FIG. 15(a) through FIG. 15(d) are each a cross-sectional view showing a step of the method for producing the organic EL display device 200. In the following, a step of vapor-depositing an organic semiconductor material on a work by use of the vapor deposition mask 100 (step of forming the organic EL layers 214R, 214G and 214B in the TFT substrate 210) will be mainly described.

Figure 14:
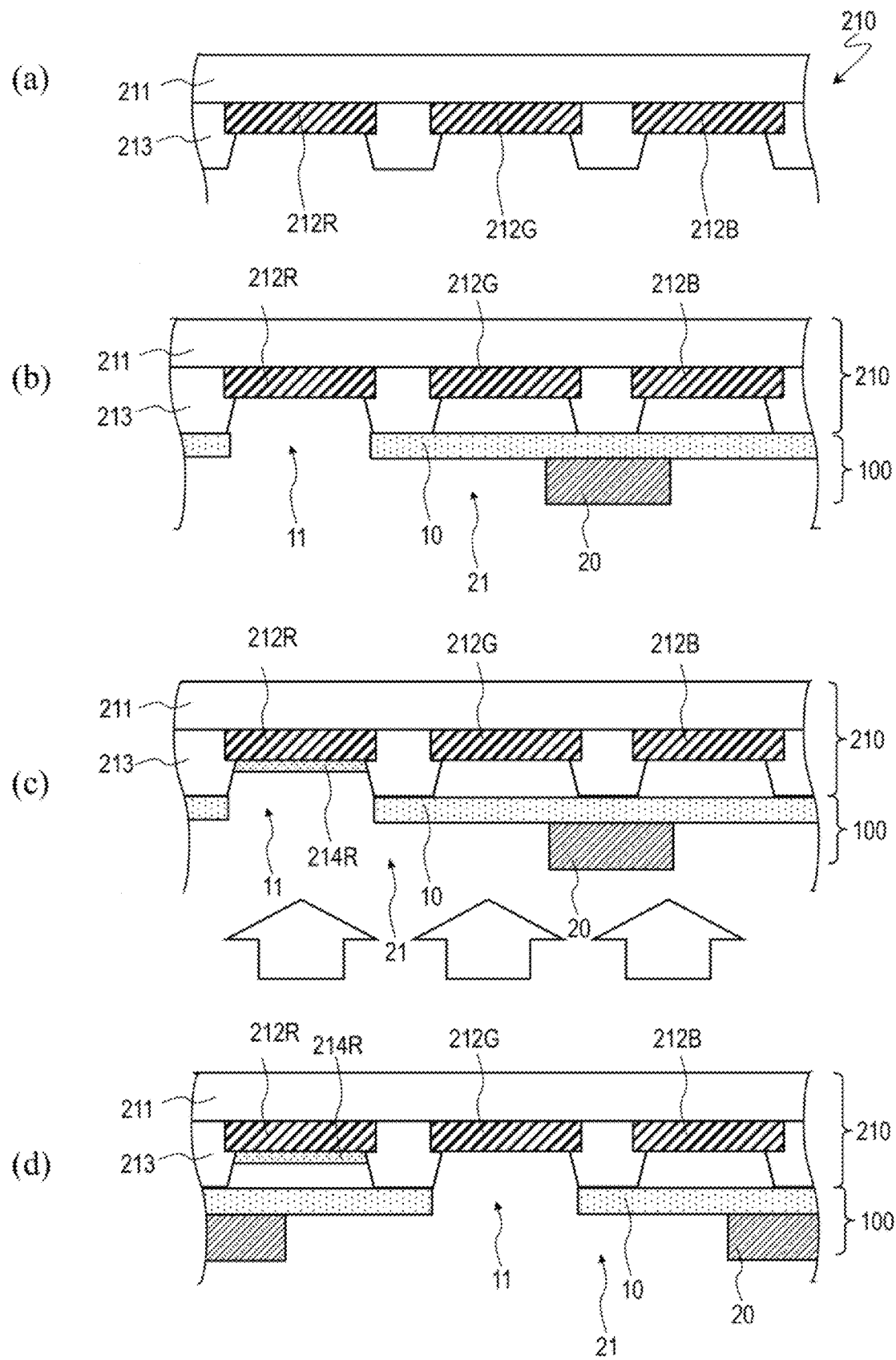
FIG. 14(a) through FIG. 14(d) are each a cross-sectional view showing a step of a method for producing the organic EL display device 200.

First, as shown in FIG. 14(a), the TFT substrate 210 including the insulating substrate, and the TFT circuit, the flattening film 211, the lower electrodes 212R, 212G and 212B and the bank 213 formed on the insulating substrate is prepared. The step of forming the TFT circuit, the flattening film 211, the lower electrodes 212R, 212G and 212B and the bank 213 may be performed by any of various known methods.

Next, as shown in FIG. 14(b), the TFT substrate 210 is put, by a carrier device, close to the vapor deposition mask 100 held in a vacuum vapor deposition device. In this step, the vapor deposition mask 100 and the TFT substrate 210 are positionally aligned with each other such that the opening 11 of the resin layer 10 overlaps the lower electrode 212R in the red pixel Pr. The vapor deposition mask 100 is put into close contact with the TFT substrate 210 by a magnetic chuck (not shown) located on the side opposite to the vapor deposition mask 100 with respect to the TFT substrate 210.

In continuation, as shown in FIG. 14(c), the organic semiconductor materials are sequentially deposited on the lower electrode 212R in the red pixel Pr by vacuum vapor deposition to form the organic EL layer 214R including the light emitting layer that emits red light. In this step, the organic semiconductor materials are deposited also on a surface of the vapor deposition mask 100 closer to the vapor deposition source (surface opposite to the TFT substrate 210 provided as a work).

Next, as shown in FIG. 14(d), the TFT substrate 210 is shifted by one pixel by the carrier device, and the vapor deposition mask 100 and the TFT substrate 210 are positionally aligned with each other such that the opening 11 of the resin layer 10 overlaps the lower electrode 212G in the green pixel Pg. The vapor deposition mask 100 is put into close contact with the TFT substrate 210 by the magnetic chuck.

Figure 15:
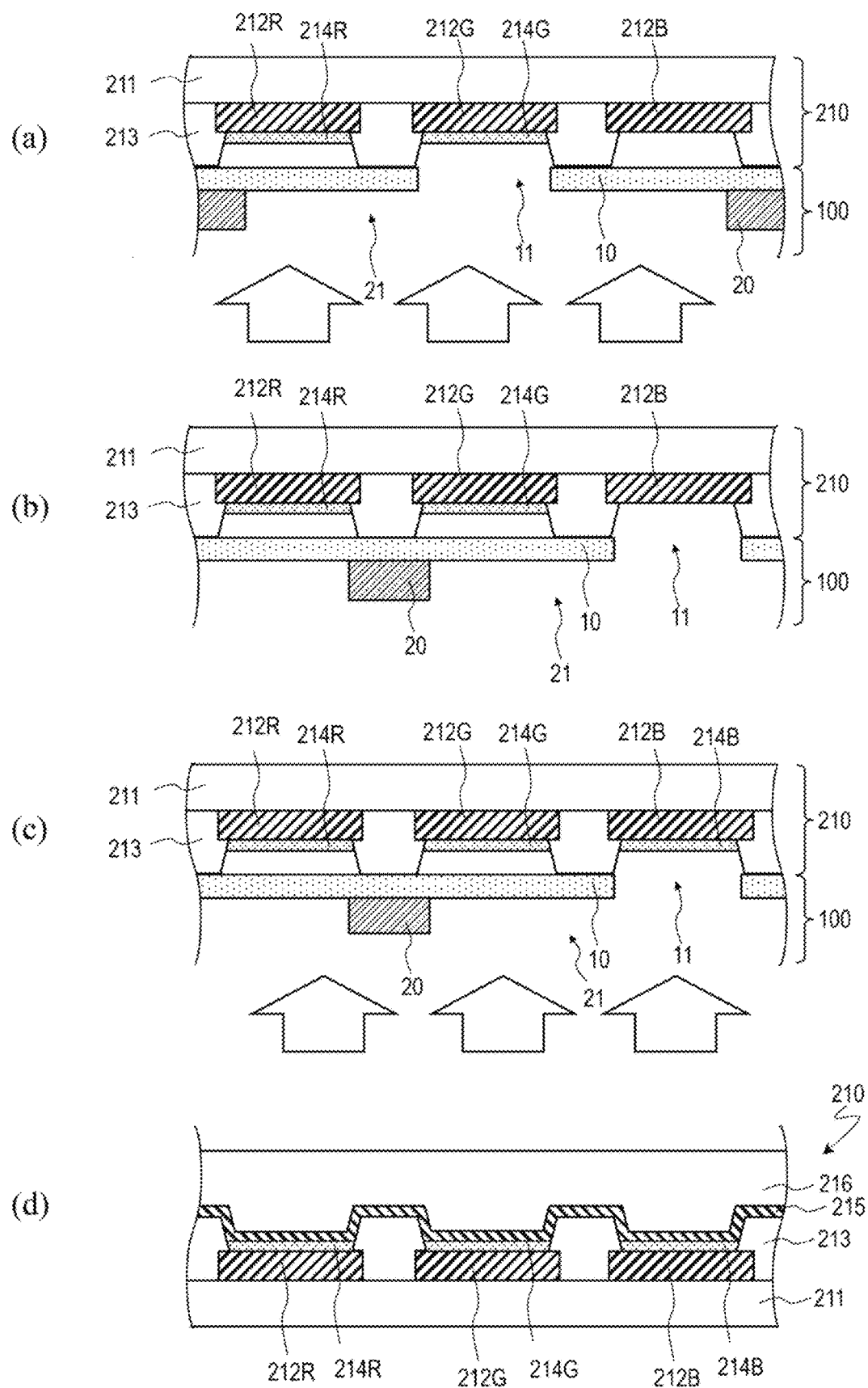
FIG. 15(a) through FIG. 15(d) are each a cross-sectional view showing a step of the method for producing the organic EL display device 200.

In continuation, as shown in FIG. 15(a), the organic semiconductor materials are sequentially deposited on the lower electrode 212G in the green pixel Pg by vacuum vapor deposition to form the organic EL layer 214G including the light emitting layer that emits green light. In this step, the organic semiconductor materials are deposited also on the surface of the vapor deposition mask 100 closer to the vapor deposition source.

Next, as shown in FIG. 15(b), the TFT substrate 210 is shifted by one pixel by the carrier device, and the vapor deposition mask 100 and the TFT substrate 210 are positionally aligned with each other such that the opening 11 of the resin layer 10 overlaps the lower electrode 212B in the blue pixel Pb. The vapor deposition mask 100 is put into close contact with the TFT substrate 210 by the magnetic chuck.

In continuation, as shown in FIG. 15(c), the organic semiconductor materials are sequentially deposited on the lower electrode 212B in the blue pixel Pb by vacuum vapor deposition to form the organic EL layer 214B including the light emitting layer that emits blue light. In this step, the organic semiconductor materials are deposited also on the surface of the vapor deposition mask 100 closer to the vapor deposition source.

Next, as shown in FIG. 15(d), the upper electrode 215 and the protective layer 216 are sequentially formed on the organic EL layers 214R, 214G and 214B. The upper electrode 215 and the protective layer 216 may be formed by any of various known methods. As a result, the TFT substrate 210 is obtained.

Then, the encapsulation substrate 220 is bonded to the TFT substrate 210 with the transparent resin layer 217. As a result, the organic EL display device 200 shown in FIG. 11 is produced.

In this example, one vapor deposition mask 100 is shifted to form the organic EL layers 214R, 214G and 214B respectively corresponding to the red pixel Pr, the green pixel Pg and the blue pixel Pb. Alternatively, three vapor deposition masks 100 respectively corresponding to the EL layers 214R, 214G and 214B in the red pixel Pr, the green pixel Pg and the blue pixel Pb may be used. In the case where the EL layers 214R, 214G and 214B in the red pixel Pr, the green pixel Pg and the blue pixel Pb have the same size and the same shape as each other, one vapor deposition mask 100 may be used to form all the EL layers 214R, 214G and 214B as described in this example.

As described above, in the vapor deposition step shown in each of FIG. 14(c), FIG. 15(a) and FIG. 15(c) (step of forming each of the EL layers 214R, 214G and 214B by vacuum vapor deposition), the vapor deposition material is deposited also on the surface of the vapor deposition mask 100 closer to the vapor deposition source. When the vapor deposition material is deposited to reach a predetermined thickness, the vapor deposition mask 100 is cleaned. For example, in the case where the predetermined thickness is set to 1 μm and a film having a thickness of about 30 nm is formed by one cycle of vapor deposition, the vapor deposition mask 100 is cleaned each time 33 cycles of the vapor deposition are performed. The vapor deposition mask 100 is cleaned by performing, for example, ultrasonic cleaning by use of isopropylalcohol, rinsing and drying at a reduced pressure sequentially.

As described above, in the vapor deposition mask 100 in this embodiment, the resin layer 10 may be easily separable from the magnetic metal layer 20. Therefore, in the case where the resin layer 10 is deteriorated as a result of being cleaned in repetition, only the resin layer 10 may be replaced, so that the magnetic metal layer 20 and the frame 30 are reused. This decreases the production cost of the organic semiconductor device.

The organic EL display device 200 may include a encapsulation film instead of the encapsulation substrate 220. Alternatively, the TFT substrate 210 may include a thin film encapsulation (TFE) structure instead of the encapsulation substrate (or the encapsulation film) being used. The thin film encapsulation structure includes, for example, a plurality of inorganic insulating film such as a silicon nitride film and the like. The thin film encapsulation structure may further include an organic insulating film.

In the above, the organic EL display device 200 of the top emission type is described as an example. Needless to say, the vapor deposition mask 100 in this embodiment is usable to produce an organic EL display device of a bottom emission type.

The organic EL display device produced by use of the vapor deposition mask 100 in this embodiment does not need to be a rigid device. The vapor deposition mask 100 in this embodiment is also preferably usable to produce a flexible organic EL display device. Such a flexible organic EL display device is produced as follows. On a polymer layer (e.g., polyimide layer) formed on a support substrate (e.g., glass substrate), a TFT circuit and the like are formed. After a protective layer is formed, the polymer layer is removed, together with the layered structure formed thereon, from the support substrate (by, for example, a laser lift-off method).

The vapor deposition mask 100 in this embodiment is also usable to produce an organic semiconductor device other than the organic EL display device, and is especially preferably usable to produce an organic semiconductor device for which a high-definition vapor deposition pattern needs to be formed.

INDUSTRIAL APPLICABILITY

A vapor deposition mask in an embodiment according to the present invention is preferably usable to produce an organic semiconductor device such as an organic EL display device or the like, and is especially preferably usable to produce an organic semiconductor device for which a high-definition vapor deposition pattern needs to be formed.

REFERENCE SIGNS LIST

10 resin layer
11 opening
18 metal film
20 magnetic metal layer
20*a* mask portion
20*a*1 solid portion
20*a*2 hollow portion
20*b* peripheral portion
21 slit (through-hole)
30 frame
100, 100A, 100B, 100C, 100D vapor deposition mask
200 organic EL display device
210 TFT substrate
211 flattening film
212R, 212G, 212B lower electrode (positive electrode)
213 bank
214R, 214G, 214B organic EL layer
215 upper electrode
216 protective layer
217 transparent resin layer
220 encapsulation substrate
U unit region
Pr red pixel
Pg green pixel
pb blue pixel

The invention claimed is:

1. A vapor deposition mask, comprising:
a resin layer including a plurality of openings;
a magnetic metal layer located so as to overlap the resin layer, the magnetic metal layer including a mask portion having such a shape as to expose the plurality of openings and a peripheral portion located so as to enclose the mask portion;
a metal film located between the peripheral portion of the magnetic metal layer and the resin layer and fixed to the resin layer; and
a frame secured to the peripheral portion of the magnetic metal layer;
wherein the resin layer is not joined to the mask portion of the magnetic metal layer but is joined to at least a part of the peripheral portion of the magnetic metal layer;
wherein the metal film is welded to the peripheral portion of the magnetic metal layer; and the resin layer is joined to the magnetic metal layer via the metal film;
the metal film has a first surface and a second surface opposite to the first surface; the first surface is in direct contact with the resin layer; and the second surface is in direct contact with the magnetic metal layer.

2. The vapor deposition mask of claim 1, wherein the magnetic metal layer is not receiving tension in any in-plane directions of the magnetic metal layer from the frame.

3. The vapor deposition mask of claim 1, wherein the resin layer is receiving tension in an in-plane direction of the resin layer from the frame and the magnetic metal layer.

4. The vapor deposition mask of claim 3, wherein the tension received by the resin layer is set such that an amount of elastic deformation of the resin layer caused by the tension is larger than, or equal to, an amount of thermal expansion of the resin layer caused when there is a temperature rise of 1° C.

5. The vapor deposition mask of claim 3, wherein the tension received by the resin layer is set such that an amount of elastic deformation of the resin layer caused by the tension is larger than, or equal to, an amount of thermal expansion of the resin layer caused when there is a temperature rise of 20° C.

6. The vapor deposition mask of claim 1, wherein where a material forming the magnetic metal layer has a linear thermal expansion coefficient of $\alpha M$ and a material forming the frame has a linear thermal expansion coefficient of $\alpha F$, the relationship of $0.5\ \alpha M \leq \alpha F \leq 2.0\ \alpha M$ is satisfied.

7. The vapor deposition mask of claim 1, wherein the magnetic metal layer and the frame are formed of the same material as each other.

8. A method for producing an organic semiconductor device, comprising vapor-depositing an organic semiconductor material by utilizing the vapor deposition mask of claim 1.

* * * * *